(12) United States Patent
Park et al.

(10) Patent No.: US 12,451,433 B2
(45) Date of Patent: Oct. 21, 2025

(54) SEMICONDUCTOR DEVICE WITH VERTICAL PATTERNS AND DATA STORAGE SYSTEM INCLUDING THE SAME

(71) Applicant: Samsung Electronics Co., Ltd., Suwon-si (KR)

(72) Inventors: Sujin Park, Gwangmyeong-si (KR); Heesung Kam, Anyang-si (KR); Byungjoo Go, Hwaseong-si (KR); Hyunju Sung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/628,233

(22) Filed: Apr. 5, 2024

(65) Prior Publication Data

US 2024/0250034 A1 Jul. 25, 2024

Related U.S. Application Data

(63) Continuation of application No. 17/373,902, filed on Jul. 13, 2021, now Pat. No. 11,984,404.

(30) Foreign Application Priority Data

Sep. 15, 2020 (KR) .................. 10-2020-0118177

(51) Int. Cl.
*H01L 23/535* (2006.01)
*H01L 25/18* (2023.01)
(Continued)

(52) U.S. Cl.
CPC ........... *H01L 23/535* (2013.01); *H10B 41/27* (2023.02); *H10B 41/41* (2023.02); *H10B 43/27* (2023.02); *H10B 43/40* (2023.02); *H01L 25/18* (2013.01)

(58) Field of Classification Search
CPC ....... H01L 23/535; H10B 41/27; H10B 41/41; H10B 43/27; H10B 43/40; H10B 43/10
See application file for complete search history.

(56) References Cited

U.S. PATENT DOCUMENTS

2017/0179153 A1\* 6/2017 Ogawa .................. H10B 41/41
2019/0172838 A1   6/2019 Jo et al.
(Continued)

FOREIGN PATENT DOCUMENTS

DE  102021113524 A1  2/2022
JP  2020515084 A     5/2020
(Continued)

OTHER PUBLICATIONS

Office Action dated Nov. 30, 2024 for corresponding application No. KR 10-2020-0118177.

*Primary Examiner* — Lex H Malsawma
*Assistant Examiner* — Bruce R. Smith
(74) *Attorney, Agent, or Firm* — Muir Patent Law, PLLC

(57) ABSTRACT

A semiconductor device includes a stack structure including interlayer insulating layers and horizontal layers on a lower structure; a memory vertical structure vertically penetrating the stack structure; first and second barrier structures penetrating the stack structure in parallel; a supporter pattern penetrating the stack structure; and through contact plugs penetrating the stack structure. The first barrier structure includes first barrier patterns arranged in a first direction and spaced apart from each other, and second barrier patterns arranged in the first direction and spaced apart from each other. Each of the first and second barrier patterns includes a linear shape extending in the first direction. In a first barrier pattern and a second barrier pattern adjacent to each other, (Continued)

a portion of the first barrier pattern opposes a portion of the second barrier pattern in a second direction perpendicular to the first direction.

20 Claims, 34 Drawing Sheets

(51) Int. Cl.
*H10B 41/27* (2023.01)
*H10B 41/41* (2023.01)
*H10B 43/27* (2023.01)
*H10B 43/40* (2023.01)

(56) References Cited

U.S. PATENT DOCUMENTS

| | | | |
|---|---|---|---|
| 2019/0237475 A1 | 8/2019 | Jung et al. | |
| 2019/0312051 A1 | 10/2019 | Park et al. | |
| 2019/0393240 A1 | 12/2019 | Kim et al. | |
| 2020/0035702 A1* | 1/2020 | Lee | H10B 41/41 |
| 2020/0043830 A1* | 2/2020 | Baek | H10B 43/40 |
| 2020/0091170 A1 | 3/2020 | Baek | |
| 2020/0266206 A1 | 8/2020 | Fukuo et al. | |
| 2020/0402905 A1* | 12/2020 | Otsu | H10B 43/40 |
| 2021/0391345 A1 | 12/2021 | Otsu et al. | |
| 2022/0399360 A1* | 12/2022 | Son | H10B 41/40 |

FOREIGN PATENT DOCUMENTS

| | | |
|---|---|---|
| KR | 10-2019-0119153 A | 10/2019 |
| KR | 1020190122824 B1 | 12/2021 |
| KR | 1020200016150 B1 | 10/2022 |
| KR | 1020190064852 B1 | 5/2023 |
| KR | 1020190117052 B1 | 12/2023 |
| KR | 1020200011852 B1 | 12/2023 |
| KR | 1020190024579 B1 | 2/2024 |

* cited by examiner

SEMICONDUCTOR DEVICE WITH VERTICAL PATTERNS AND DATA STORAGE SYSTEM INCLUDING THE SAME

CROSS-REFERENCE TO RELATED APPLICATION

This application is a continuation application of U.S. patent application Ser. No. 17/373,902 filed on Jul. 13, 2021, which claims the benefit of priority under 35 U.S.C. 119 to Korean Patent Application No. 10-2020-0118177, filed on Sep. 15, 2020, in the Korean Intellectual Property Office, and entitled: "Semiconductor Device and Data Storage System Including the Same," the disclosure of which is incorporated by reference herein in its entirety.

BACKGROUND

1. Field

Embodiments relate to a semiconductor device and a data storage system including the same.

2. Description of the Related Art

A semiconductor device storing high-capacity data may be used in a data storage system. To increase data storage capacity of a semiconductor device, a semiconductor device including memory cells arranged three-dimensionally has been considered.

SUMMARY

Embodiments are directed to a semiconductor device, including: a lower structure including a peripheral circuit; a stack structure including interlayer insulating layers and horizontal layers alternately stacked on the lower structure; a vertical memory structure penetrating through the stack structure in a vertical direction; a first barrier structure and a second barrier structure penetrating through the stack structure in the vertical direction and parallel to each other; a supporter pattern penetrating through the stack structure in the vertical direction and spaced apart from the first and second barrier structures; and through contact plugs penetrating through the stack structure in the vertical direction between the first and second barrier structures. The first barrier structure may include first barrier patterns arranged in a first direction and spaced apart from each other, and second barrier patterns arranged in the first direction and spaced apart from each other. Each of the first and second barrier patterns includes a linear shape extending in the first direction. In a first barrier pattern and a second barrier pattern adjacent to each other among the first and second barrier patterns, a portion of the first barrier pattern opposes a portion of the second barrier pattern in a second direction perpendicular to the first direction.

Embodiments are also directed to a semiconductor device, including: a lower structure including a peripheral circuit; a stack structure including interlayer insulating layers and horizontal layers on the lower structure, wherein the interlayer insulating layers and the horizontal layers are alternately stacked in a memory cell region of the stack structure, extend from the memory cell region in a staircase region of the stack structure, and have a staircase shape; a first main separation structure and a second main separation structure penetrating through the stack structure and parallel to each other on the lower structure; a vertical memory structure penetrating through the memory cell region of the stack structure; a supporter pattern penetrating through the staircase region of the stack structure; a first barrier structure and a second barrier structure penetrating through the staircase region of the stack structure and parallel to each other between the first and second main separation structures; and through contact plugs penetrating through the stack structure between the first and second barrier structures. The horizontal layers may include gate horizontal layers and insulating horizontal layers. The supporter pattern may penetrate the gate horizontal layers. The through contact plugs may penetrate the insulating horizontal layers. Each of the first and second barrier structures may include first barrier patterns arranged in a first direction and spaced apart from each other, and second barrier patterns arranged in the first direction and spaced apart from each other. Each of the first and second barrier patterns may include a linear shape extending in the first direction. In a first barrier pattern and a second barrier pattern adjacent to each other among the first and second barrier patterns, a portion of the first barrier pattern may oppose a portion of the second barrier pattern in a second direction.

Embodiments are also directed to a data storage system, including: a main substrate; a controller on the main substrate, and a semiconductor device on the main substrate and electrically connected to the controller, the semiconductor device including: a lower structure including a peripheral circuit; a stack structure including interlayer insulating layers and horizontal layers alternately stacked on the lower structure; a vertical memory structure penetrating through the stack structure in a vertical direction; a first barrier structure and a second barrier structure penetrating through the stack structure in the vertical direction and parallel to each other; a supporter pattern penetrating through the stack structure in the vertical direction and spaced apart from the first and second barrier structures; and through contact plugs penetrating through the stack structure in the vertical direction between the first and second barrier structures. The first barrier structure may include first barrier patterns arranged in a first direction and spaced apart from each other, and second barrier patterns arranged in the first direction and spaced apart from each other. Each of the first and second barrier patterns may include a linear shape extending in the first direction. In a first barrier pattern and a second barrier pattern adjacent to each other among the first and second barrier patterns, a portion of the first barrier pattern may oppose a portion of the second barrier pattern in a second direction perpendicular to the first direction.

BRIEF DESCRIPTION OF DRAWINGS

Features will become apparent to those of skill in the art by describing in detail example embodiments with reference to the attached drawings in which.

DETAILED DESCRIPTION

Below, a semiconductor device according to an example embodiment will now be described with reference to FIGS. 1 to 4B.

Figure 1:
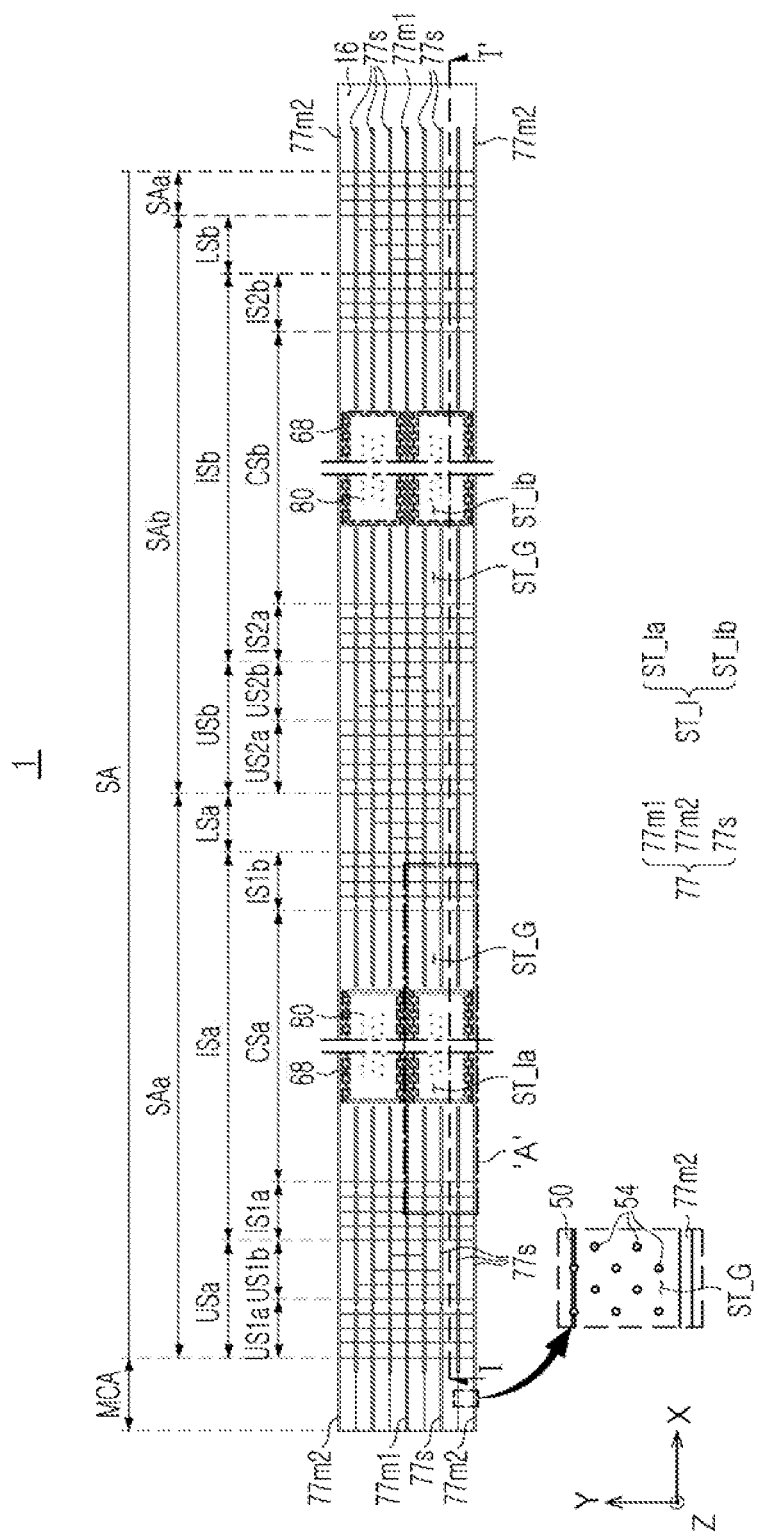
FIG. 1 is a plan diagram of a semiconductor device according to an example embodiment.
Figure 2:
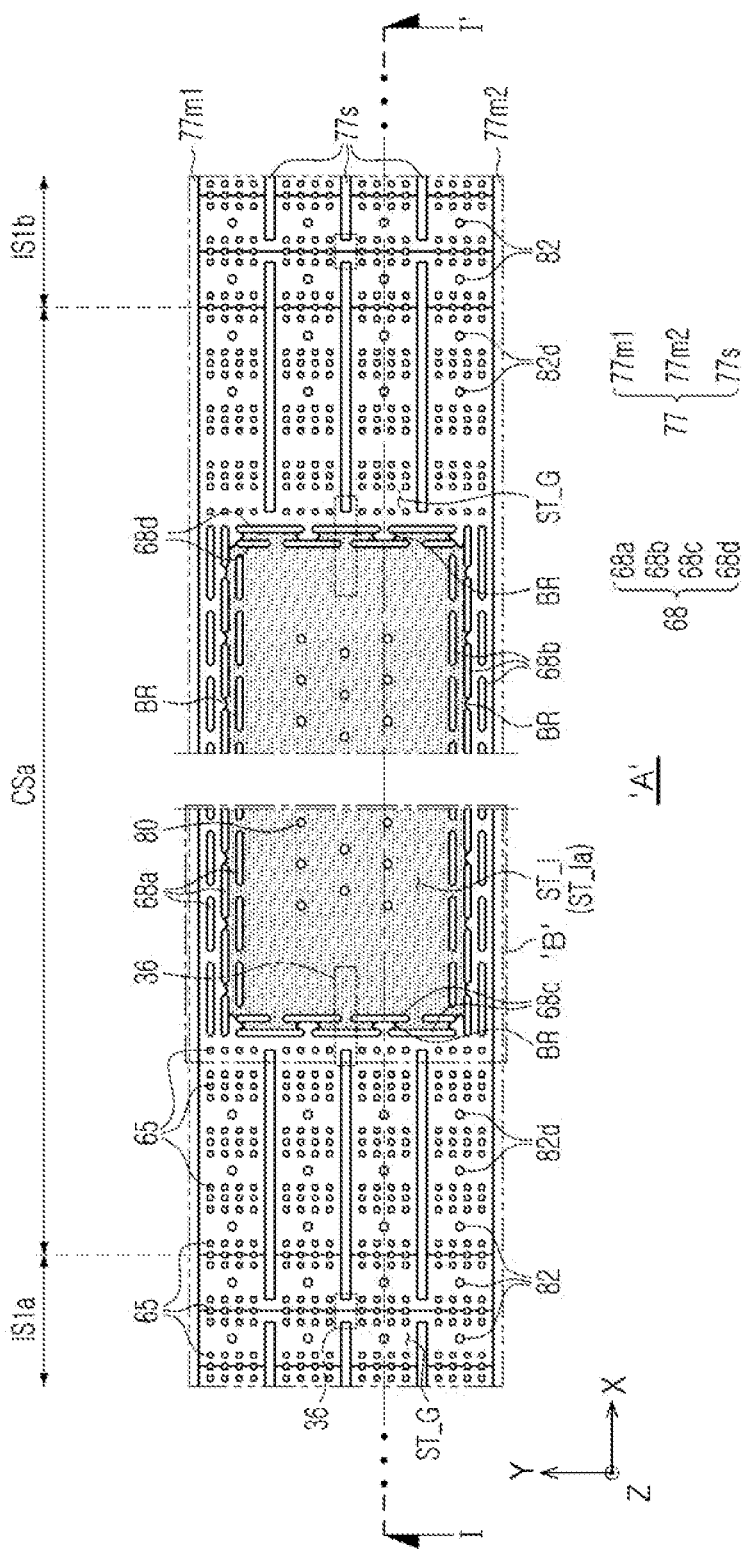
FIG. 2 is an enlarged plan diagram of a portion of the semiconductor device illustrated in FIG. 1.
Figure 3:
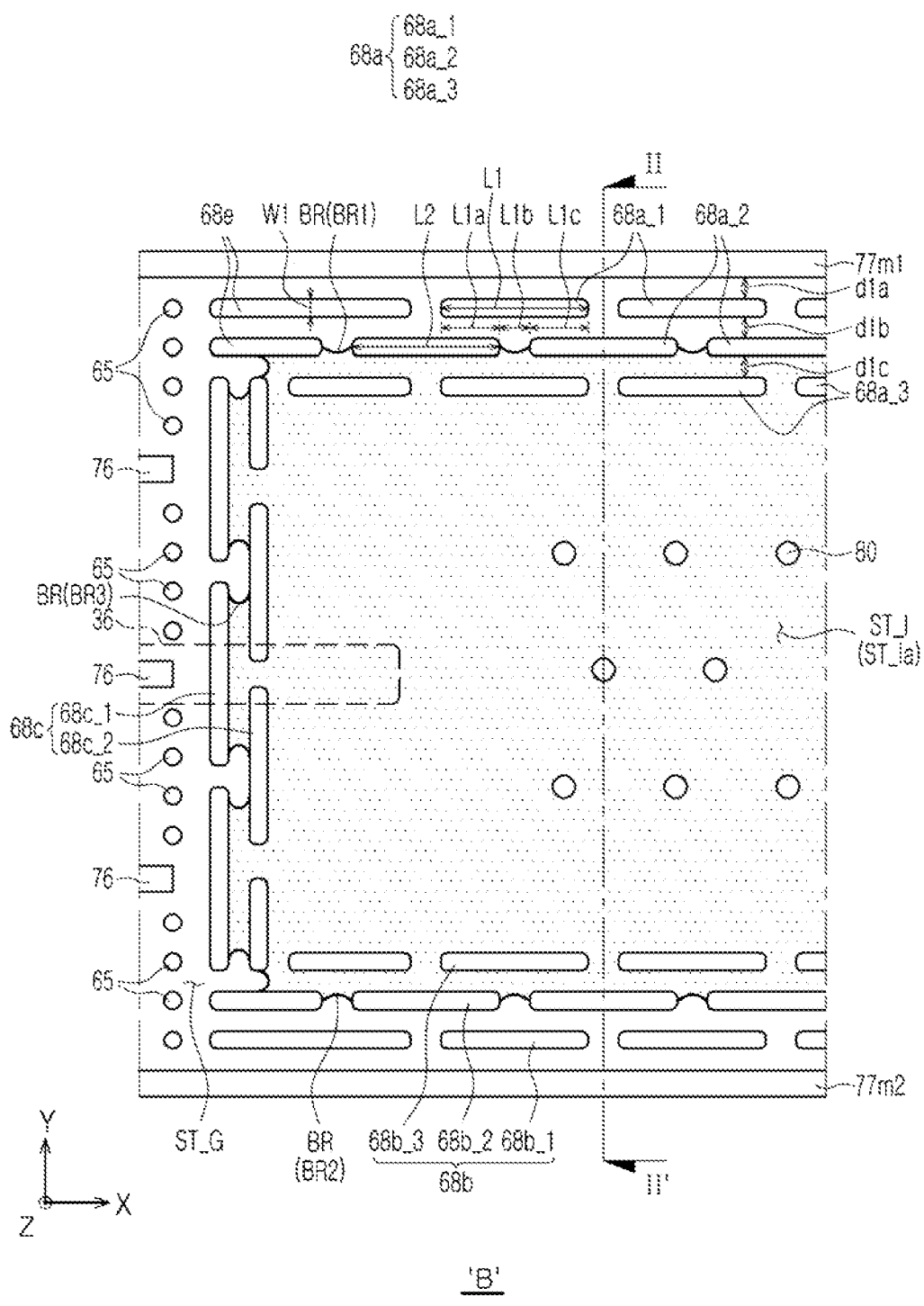
FIG. 3 is an enlarged plan diagram of a portion of the semiconductor device illustrated in FIG. 2.
Figure 4A:
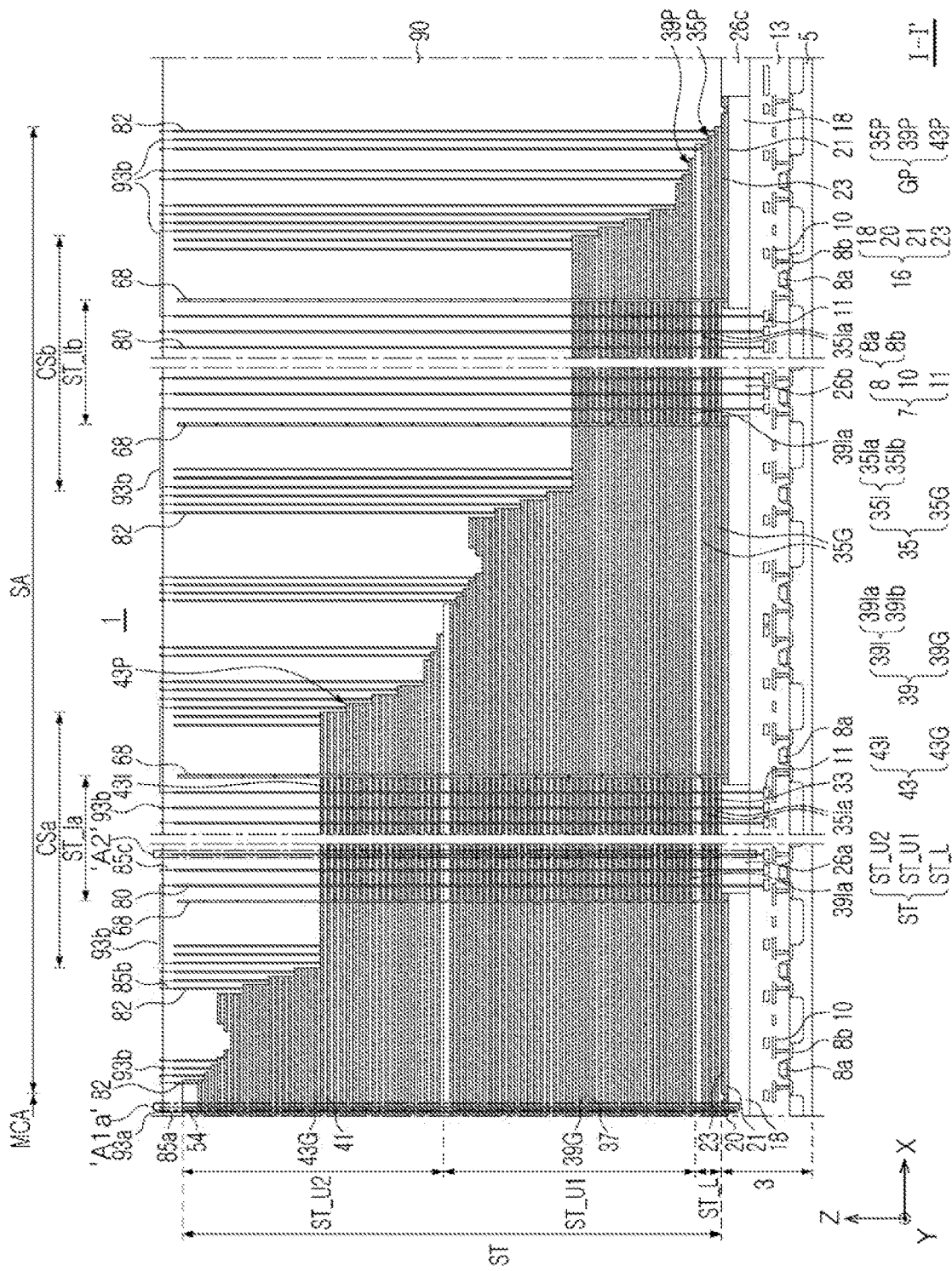
FIG. 4A is a cross-sectional diagram taken along line I-I' in FIG. 1.
Figure 4B:
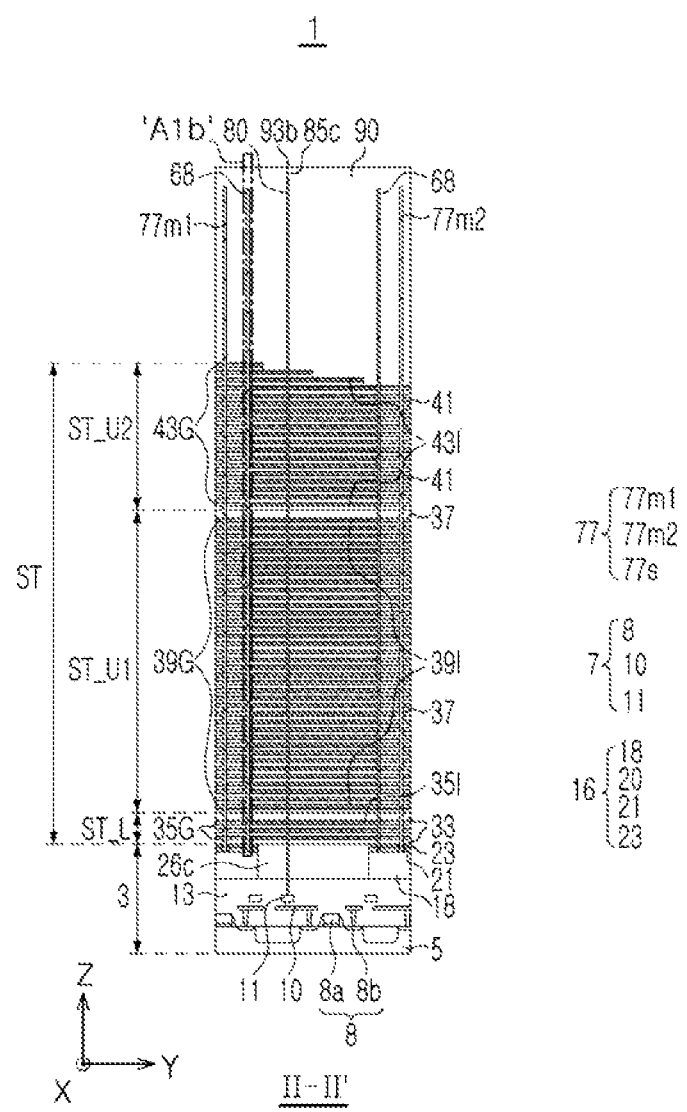
FIG. 4B is a cross-sectional diagram taken along line II-II' in FIG. 3.

FIG. 1 is a plan diagram of a semiconductor device according to an example embodiment. FIG. 2 is an enlarged plan diagram illustrating portion "A" illustrated in FIG. 1. FIG. 3 is an enlarged plan diagram illustrating portion "B" illustrated in FIG. 2. FIG. 4A is a cross-sectional diagram taken along line I-I' in FIG. 1. FIG. 4B is a cross-sectional diagram taken along line II-II' in FIG. 1.

Referring to FIGS. 1 to 4B, a semiconductor device 1 according to an example embodiment may include a lower structure 3, a stack structure ST, vertical memory structures 54, a barrier structure 68, supporter patterns 65, and through contact plugs 80.

The lower structure 3 may include a peripheral circuit 7. For example, the lower structure 3 may include a semiconductor substrate 5, a peripheral transistor 8 on the semiconductor substrate 5, a peripheral wiring 10 electrically connected to the peripheral transistor 8, peripheral pads 11 electrically connected to the peripheral transistor 8, peripheral pads 11 electrically connected to the peripheral wiring 10, and a lower insulating layer 13 covering the peripheral transistor 8, the peripheral wiring 10, and the peripheral pads 11. The peripheral transistor 8 may include a peripheral gate 8a and a peripheral source/drain 8b. The peripheral transistor 8 and the peripheral wiring 10 may be included in the peripheral circuit 7.

The lower structure 3 may further include a pattern structure 16. For example, the pattern structure 16 may include a lower pattern layer 18, a first intermediate pattern layer 20 and a second intermediate pattern layer 21 spaced apart from each other on the lower pattern layer 18, and an upper pattern layer 23 covering the first and second intermediate pattern layers 20a and 21 on the lower pattern layer 18.

In an example embodiment, the lower pattern layer 18 may include a first polysilicon, the first intermediate pattern layer 20 may include a second polysilicon, and the upper pattern layer 23 may include a third polysilicon. For example, the lower pattern layer 18, the first intermediate pattern layer 20, and the upper pattern layer 23 may include polysilicon having N-type conductivity.

In an example embodiment, the upper pattern layer 23 may be in contact with the lower pattern layer 18 between the first and second intermediate pattern layers 20 and 21, and may partially penetrate the second intermediate pattern layer and may be in contact with the lower pattern layer 22.

In an example embodiment, the second intermediate pattern layer 21 may include at least two types of materials. For example, the second intermediate pattern layer 21 may include a silicon nitride layer and a silicon oxide layer covering upper and lower surfaces of the silicon nitride layer. In another example embodiment, the second intermediate pattern layer 21 may include a polysilicon layer and a silicon oxide layer covering upper and lower surfaces of the polysilicon layer.

In an example embodiment, the lower structure 3 may include first gap-fill insulating layers 26a and second gap-fill insulating layers 26b penetrating the pattern structure 16, and an outer insulating layer 26c disposed on an external side surface of the pattern structure 16. The first and second gap-fill insulating layers 26a and 26b and the outer insulating layer 26c may include silicon oxide.

The stack structure ST may include interlayer insulating layers 33, 39, and 41 and horizontal layers 35, 39, and 43.

The interlayer insulating layers 33, 39, and 41 and the horizontal layers 35, 39, and 43 may be alternately stacked in the first region MCA of the stack structure ST, may extend from the first region MCA to the second region SA of the stack structure ST, and may have a staircase shape in the second region SA. Thus, the stack structure ST may have a staircase shape in the second region SA.

In example embodiments, the first region MCA may be referred to as a memory cell region, and the second region SA may be referred to as a staircase region, a connection region, or a contact region.

The stack structure ST may include a lower stack structure ST_L, a first upper stack structure ST_U1 on the lower stack structure ST_L, and a second upper stack structure ST_U1 on the first upper stack structure ST_U1.

The lower stack structure ST_L may include lower interlayer insulating layers 33 and lower horizontal layers 35 alternately stacked. Among the lower interlayer insulating layers 33 and the lower horizontal layers 35, a lowermost layer and an uppermost layer may be lower interlayer insulating layers. In an example embodiment, among the lower interlayer insulating layers 33, the uppermost lower interlayer insulating layer may have a thickness greater than a thickness of each of the other lower interlayer insulating layers.

The first upper stack structure ST_U1 may include first upper interlayer insulating layers 37 and first upper horizontal layers 39 alternately stacked. Among the first upper interlayer insulating layers 37 and the first upper horizontal layers 39, a lowermost layer and an uppermost layer may be first upper interlayer insulating layers. In an example embodiment, among the first upper interlayer insulating layers 37, the uppermost first upper interlayer insulating layer may have a thickness greater than a thickness of each of the other first upper interlayer insulating layers.

The second upper stack structure ST_U2 may include second upper interlayer insulating layers 41 and second upper horizontal layers 43 alternately stacked. Among the second upper interlayer insulating layers 41 and the second upper horizontal layers 43, a lowermost layer and an uppermost layer may be second upper interlayer insulating layers. In an example embodiment, among the second upper interlayer insulating layers 41, an uppermost second upper interlayer insulating layer may have a thickness greater than a thickness of each of the other second upper interlayer insulating layers.

In an example embodiment, the staircase region SA of the stack structure ST may include staircase regions USa, ISa, and LSa of the second upper stack structure ST_U2, staircase regions USb, ISb, and LSb of the first upper stack structure ST_U1, and a staircase region L2 of the lower stack structure ST_L, arranged in order in a direction of the staircase region SA from the memory cell region MCA, in the first direction X, for example.

The staircase region L2 of the lower stack structure ST_L may have a staircase shape lowered by a first height difference in the first direction X.

In the staircase region SA, the first and second upper stack structures ST_U1 and ST_U2 may have substantially the same planar staircase shape or similar planar staircase shapes. For example, in the staircase region SA, each of the first and second upper stack structures ST_U1 and ST_U2 may include the upper staircase regions USa and USb, the intermediate staircase regions ISa and ISb, and the lower staircase regions LSa and LSb, arranged in order in the first direction.

In each of the first and second upper stack structures ST_U1 and ST_U2, the upper staircase regions USa and USb may include first upper staircase regions US1a and US2a having a staircase shape lowered by the first height difference in the first direction X, and second upper staircase regions US1b and US2b having a staircase shape rising by the first height difference in the first direction X from the first upper staircase regions US1a and US2a.

In each of the first and second upper stack structures ST_U1 and ST_U2, the lower staircase regions LSa and LSb may include a staircase shape lowered by the first height difference in the first direction X.

In each of the first and second upper stack structures ST_U1 and ST_U2, intermediate staircase regions ISa and ISb may include first intermediate staircase regions IS1a and IS2a, staircase connection regions CSa and CSb, and second intermediate staircase regions IS1b and IS2b, arranged in order in the first direction X.

In each of the first and second upper stack structures ST_U1 and ST_U2, the first intermediate staircase regions IS1a and IS2a may have upper surfaces disposed on a level higher than a level of the second intermediate staircase regions IS1b and IS2b.

The first intermediate staircase region IS1a and IS2a and the second intermediate staircase region IS1b and IS2b may have a staircase shape lowered by a second height difference greater than the first height difference in the first direction X. The first intermediate staircase regions IS1a and IS2a and the second intermediate staircase regions IS1b and IS2b may have a staircase shape lowered or rising by the first height difference in a second direction Y perpendicular to the first direction X.

In each of the first and second upper stack structures ST_U1 and ST_U2, the staircase connection regions CSa and CSb may have a staircase shape substantially planar in the first direction X, and lowered or rising by the first height difference in the second direction Y.

In the stack structure ST, the lower horizontal layers 35 may include gate horizontal layers 35G and insulating horizontal layers 35I, the first upper horizontal layers 39 may include gate horizontal layers 39G and insulating horizontal layers 39I, and the second upper horizontal layers 43 may include gate horizontal layers 43G and insulating horizontal layers 43I. For example, on one height level, one of the horizontal layers may include one of the gate horizontal layers and at least one insulating horizontal layer connected to the one of the gate horizontal layers.

In the stack structure ST, a region in which the gate horizontal layers 35G, 39G, and 43G are disposed may be defined as a gate stack region ST_G, and a region in which the insulating horizontal layers 35I, 39I, and 43I are disposed may be defined as the insulating stack region ST_I.

The interlayer insulating layers 33, 37, and 41 may be formed of silicon oxide. The insulating horizontal layers 35I, 39I, and 43I may be formed of an insulating material different from the material of the interlayer insulating layers 33, 37, and 41, e.g., silicon nitride.

The staircase region SA may include insulating stack regions ST_I. The insulating stack regions ST_I may include a first insulating stack region ST_Ia and a second insulating stack region ST_Ib disposed in order in the first direction X and spaced apart from each other.

The first insulating stack region ST_Ia may be disposed in the lower stack structure ST_L, the first upper stack structure ST_U1, and the second upper stack structure ST_U2. The second insulating stack region ST_Ib may be disposed in the lower stack structure ST_L and the first upper stack structure ST_U1.

In the lower stack structure ST_L, the lower insulating horizontal layers 35I may include lower insulating horizontal layers 35Ia disposed in the first insulating stack region ST_Ia and lower insulating horizontal layers 35Ib disposed in the second insulating stack region ST_Ib. Thus, one of the lower horizontal layers 35 may include a gate horizontal layer 35G and insulating horizontal layers 35Ia and 35Ib connected to the gate horizontal layer 35G.

In the first upper stack structure ST_U1, the first upper insulating horizontal layers 39I may include first upper insulating horizontal layers 39Ia disposed in the first insulating stack region ST_Ia and first upper insulating horizontal layers 39Ib disposed in the second insulating stack region ST_Ib. Thus, one of the first upper horizontal layers 39 may include a gate horizontal layer 39G and insulating horizontal layers 39Ia and 39Ib connected to the gate horizontal layer 39G.

In the second upper stack structure ST_U2, the second upper insulating horizontal layers 43I may be disposed in the first insulating stack region ST_Ia.

In the staircase region SA of the stack structure ST, the gate horizontal layers 35G, 39G, and 43G may have gate pad regions 35P, 39P, and 43P. The gate pad regions 35P, 39P, and 43P may not be covered by another gate horizontal layer.

A capping insulating structure 90 may cover the stack structure ST. The capping insulating structure 90 may include stacked silicon oxide layers.

Vertical memory structures 54 may penetrate through the memory cell region MCA of the stack structure ST. The vertical memory structures 54 may be in contact with the pattern structure 16. The vertical memory structures 54 may penetrate the gate horizontal layers 35G, 39G, and 43G.

Supporter patterns 65 may penetrate through the staircase region SA of the stack structure ST and extending into the capping insulating structure 90. The supporter patterns 65 may penetrate the gate horizontal layers 35G, 39G, and 43G of the gate stack region ST_G of the stack structure ST.

A barrier structure 68 may penetrate through the staircase region SA of the stack structure ST and extend into the capping insulating structure 90.

Gate contact plugs 82 may be disposed in contact with the gate pad regions 35P, 39P and 43P of the gate horizontal layers 35G, 39G, and 43G and extend into the capping insulating structure 90. The gate pad regions 35P, 39P, and 43P in contact with the gate contact plugs 82 may be formed of a conductive material.

A portion of the gate contact plugs 82 may be dummy gate contact plugs 82d.

Peripheral through contact plugs 80 may penetrate through the stack structure ST and extend into the capping insulating structure 90. The peripheral through contact plugs 80 may penetrate the insulating stack region ST_I of the stack structure ST. The peripheral through contact plugs 80 may include peripheral through contact plugs penetrating the first insulating stack region ST_Ia and peripheral through contact plugs penetrating the second insulating stack region ST_Ib.

The peripheral through contact plugs 80 may extend downwardly from a portion penetrating the stack structure ST, may penetrate the first and second gap-fill insulating layers 26a and 26b, and may be electrically connected to the peripheral pads 11 of the peripheral circuit 7.

In the capping insulating structure 90, bit line connection patterns 85a electrically connected to the vertical memory structures 54, gate connection patterns 85b electrically connected to the gate contact plugs 82, and peripheral connection patterns 85c electrically connected to the peripheral through contact plugs 80 may be disposed.

Bit lines 93a may be disposed on the bit line connection patterns 85a. Gate connection wirings 93b may be disposed on the gate connection patterns 85b and the peripheral connection patterns 85c.

The vertical memory structures 54 may be electrically connected to the bit lines 93a. The gate horizontal layers 35G, 39G, and 43G may be electrically connected to the peripheral circuit 7 through the gate contact plugs 82, the gate connection wirings 93b, and the through contact plugs 80.

Separation structures 77 may penetrate through the stack structure ST in the vertical direction Z and extend into the capping insulating structure 90. Each of the separation structures 77 may have a linear shape extending in the first direction X.

The separation structures 77 may include first and second separation structures 77m1 and 77m2 spaced apart from each other in second direction Y and parallel to each other.

The separation structures 77 may include auxiliary separation structures 77s disposed between the first and second separation structures 77m1 and 77m2 and penetrating the stack structure ST. Each of the auxiliary separation structures 77s may have a length shorter than a length of the stack structure ST in the first direction X. The auxiliary separation structures 77s may be disposed in the staircase region SA of the stack structure ST, and at least one of the auxiliary separation structures 77s may extend into the memory cell region MCA of the stack structure ST.

Upper select gate separation patterns 50 disposed between the separation structures 77 may be disposed in the memory cell region MCA. The upper select gate separation patterns 50 may among the gate horizontal layers 35G, 39G, and 43G, allow gate horizontal layers (which may be upper select gate lines disposed on a level higher than a level of gate horizontal layers that are word lines) to be spaced apart from each other in the second direction Y.

The planar shape of the barrier structure 68 will now be further described with reference to FIGS. 2 and 3.

Referring to FIGS. 2 and 3, the barrier structure 68 may include barrier patterns spaced apart from each other in the first direction X and the second direction Y. A portion of the barrier patterns may penetrate the gate horizontal layers 35G, 39G, and 43G. A portion of the barrier patterns may penetrate a region between the gate stack region ST_G including the gate horizontal layers 35G, 39G, and 43G and the insulating stack region ST_I including the insulating horizontal layers 35I, 39I, and 43I.

The barrier structures 68 may include a first barrier structure 68a and a second barrier structure 68b parallel to each other and extending in the first direction X, and a third barrier structure 68c and a fourth barrier structure 68d parallel to each other and extending in the second direction Y. The first to fourth barrier structures 68a, 68b, 68c, and 68d may have a quadrangular ring shape. The first barrier structure 68a may be adjacent to the first separation structure 77m1. The second barrier structure 68b may be adjacent to the second separation structure 71m2.

The first barrier structure 68a may include first barrier patterns 68a_1 arranged in the first direction X and spaced apart from each other, and second barrier patterns 68a_2 arranged in the first direction X and spaced apart from each other. The first barrier patterns 68a_1 and the second barrier patterns 68a_2 may be arranged in a zigzag pattern.

At least a portion of each of the first and second barrier patterns 68a_1 and 68a_2 may have a linear shape extending in the first direction X. For example, each of the first and second barrier patterns 68a_1 and 68a_2 may have a bar shape extending in the first direction X.

In an example embodiment, the first and second barrier patterns 68a_1 and 68a_2 may have the same width W1 in the second direction Y.

In an example embodiment, a length L1 of at least one of the first barrier patterns 68a_1 in the first direction X may be the same as a length L2 of at least one of the second barrier patterns 68a_2 in the first direction X.

In a first barrier pattern and a second barrier pattern adjacent to each other among the first and second barrier patterns 68a_1 and 68a_2, the first barrier pattern 68a_1 may include a first portion L1a, a second portion L1b, and a third portion L1c. In the first barrier pattern 68a_1, the first portion L1a and the third portion L1c may oppose the second barrier pattern 68a_2 in the second direction Y, and the second portion L1b may not oppose the second barrier pattern 68a_2 in the second direction Y.

Here, a length of the second portion L1b in the first direction X may be the same as a distance between the second barrier patterns 68a_2 adjacent to each other in the first direction X.

In an example embodiment, a length of a portion of the first barrier pattern 68a_1 in the first direction X, opposing a portion of the second barrier pattern 68a_2 in the second direction Y, may be greater than a width of the supporter pattern 65 in the first direction X. For example, in the first barrier pattern 68a_1, a length of at least one of the first portion L1a and the third portion L1c in the first direction X may be greater than a width of the supporter pattern 65 in the first direction X.

In an example embodiment, in the first barrier pattern 68a_1, a length of at least one of the first portion L1a and the third portion L1c in the first direction X may be two or more times greater than the width of the supporter pattern 65 in the first direction X.

In an example embodiment, in the first barrier pattern 68a_1, a length of at least one of the first portion L1a and the third portion L1c in the first direction X may be substantially the same as a length of the second portion L1b.

In an example embodiment, in the first barrier pattern 68a_1, a length of at least one of the first portion L1a and the third portion L1c in the first direction X may be greater than the length of the second portion L1b.

In an example embodiment, in the first barrier pattern 68a_1, a length of at least one of the first portion L1a and the third portion L1c in the first direction X may be two or more times greater than the length of the second portion L1b.

In an example embodiment, in the first barrier pattern 68a_1, a length of at least one of the first portion L1a and the third portion L1c in the first direction X may be at least three or more times greater than the length of the second portion L1b.

In an example embodiment, a spacing d1b between the first barrier pattern 68a_1 and the second barrier pattern 68a_2 may be less than a length of at least one of the first portion L1a and the third portions L1c in the first direction X in the first barrier pattern 68a_1.

In an example embodiment, a spacing d1b between the first barrier pattern 68a_1 and the second barrier pattern 68a_2 may be less than a length of the second portion L1b in the first direction X in the first barrier pattern 68a_1.

In an example embodiment, the first barrier structure 68a may further include first inner barrier patterns 68a_3 arranged in the first direction and spaced apart from each other. The first inner barrier patterns 68a_3 may be arranged in a zigzag pattern with the second barrier patterns 68a_2.

The second barrier structure 68b may be mirror-symmetrical with the first barrier structure 68a. For example, the second barrier structure 68b may include first and second barrier patterns 68b_1 and 68b_2 and first inner barrier patterns 68b_3 corresponding to the first and second barrier patterns 68a_1 and 68a_2 and the first inner barrier patterns 68a_3 of the first barrier structure 68a, respectively.

The third barrier structure 68c may be disposed between one end of the first barrier structure 68a and one end of the second barrier structure 68b. The third barrier structure 68c may include first barrier patterns 68c_1 arranged in the second direction Y and spaced apart from each other, and second barrier patterns 68c_1 arranged in the second direction Y and spaced apart from each other. In the third barrier structure 68c, the first barrier patterns 68c_1 and the second barrier patterns 68c_2 may be arranged in a zigzag pattern.

Herein, the term "barrier pattern" may be used interchangeably with the term "horizontal pattern." For example, in the third barrier structure 68c, the first barrier patterns 68c_1 and the second barrier patterns 68c_2 may be referred to as first horizontal patterns and second horizontal patterns, respectively.

The fourth barrier structure 68d may be mirror-symmetrical with the third barrier structure 68c.

In the third barrier structure 68c, each of the first and second barrier patterns 68c_1 and 68c_2 may include a linear shaped portion extending in the second direction Y. For example, in the third barrier structure 68c, each of the first and second barrier patterns 68c_1 and 68c_2 may have a bar shape extending in the second direction Y.

In the third barrier structure 68c, the first barrier patterns 68c_1 may be adjacent to ends of the auxiliary separation structures 76. Ends of the auxiliary separation structures 76 may oppose central portions of the first barrier patterns 68c_1 of the third barrier structure 68c. For example, an end of one of the auxiliary separation structures 76 may oppose a central portion of one of the first barrier patterns 68c_1 of the third barrier structure 68c.

The barrier structure 68 may further include edge barrier patterns 68e disposed on an edge of the first barrier structure 68a. The edge barrier patterns 68e may be spaced apart from the first and second barrier patterns 68a_1 and 68a_2 of the first barrier structure 68a in the first direction X.

Lower select gate separation patterns 36 may separate gate horizontal layers 35G of the gate horizontal layers 35G, 39G, and 43G, which may be lower select gate lines. One of the lower select separation patterns 36 may overlap an end of one of the auxiliary separation structures 77s (e.g., the auxiliary separation structure disposed in a central portion,) and may extend to the insulating stack region ST_I. The lower select gate separation patterns 36 may be disposed on a level lower than a level of the gate horizontal layers 39G and 43G, which may be word lines, among the gate horizontal layers 35G, 39G, and 43G.

In an example embodiment, the first barrier patterns 68a_1 may be spaced apart from the insulating horizontal layers of the insulating stack region ST_I and may be in contact with gate horizontal layers of the gate stack region ST_G.

In an example embodiment, each of the second barrier patterns 68b_1 may include a portion in contact with the insulating horizontal layers of the insulating stack region ST_I and a portion in contact with the gate horizontal layers of the gate stack region ST_G.

In an example embodiment, the first inner barrier patterns 68c_1 may be in contact with insulating horizontal layers of the insulating stack region ST_I and spaced apart from the gate horizontal layers of the gate stack region ST_G.

Boundary surfaces BR in contact with the insulating horizontal layers of the insulating stack region ST_I and the gate horizontal layers of the gate stack region ST_G may be disposed in the barrier structure 68, and may be in contact with one of the barrier patterns. For example, the boundary surfaces BR may include a boundary surface BR1 disposed in the first barrier structure 68a and in contact with the second barrier patterns 68a_2, a boundary surface BR2 disposed in the second barrier structure 68b and in contact with the second barrier patterns 68b_2, and a boundary surface BR3 disposed in the third barrier structure 68c and in contact with the first and second barrier patterns 68c_1 and 68c_2.

Below, example embodiments of the pattern structure 16, the stack structure ST, and the vertical memory structure 54 will now be described with reference to FIG. 5A.

Figure 5A:
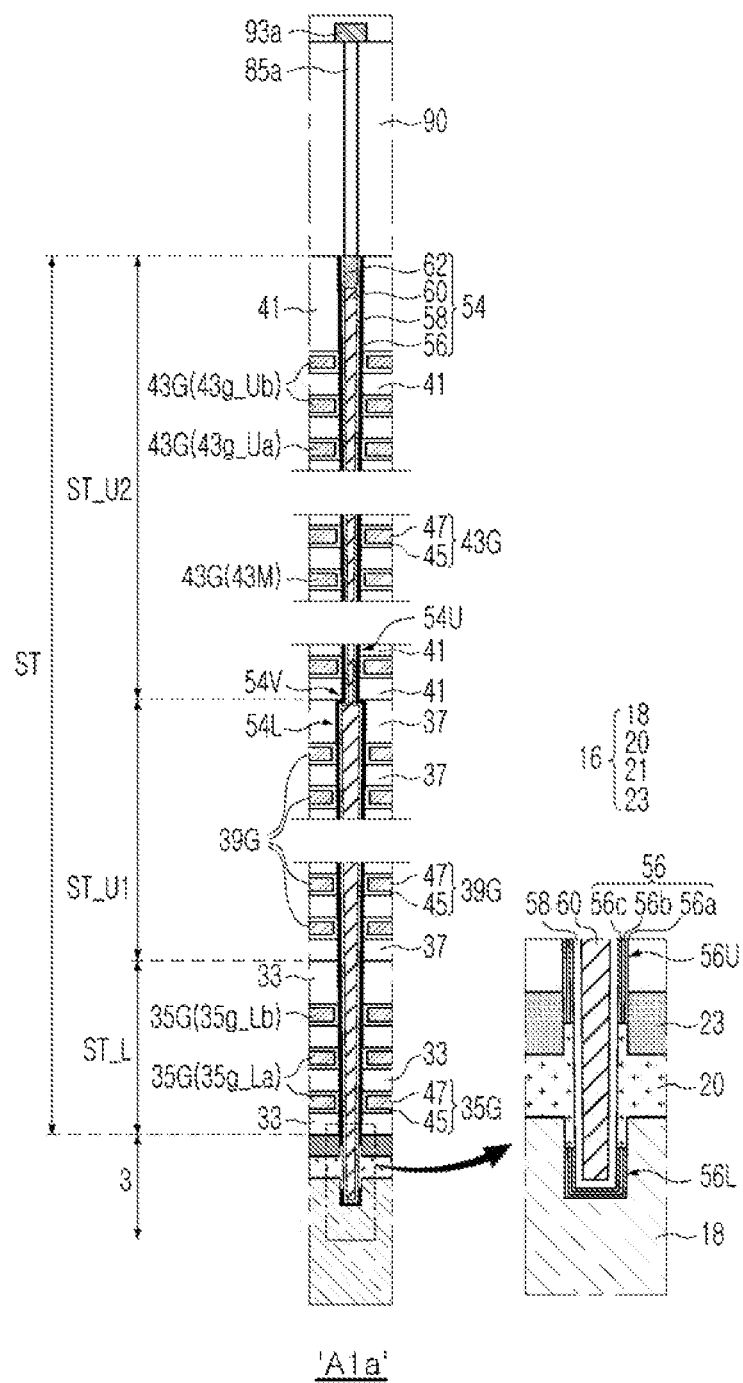
FIG. 5A is an enlarged cross-sectional diagram of a portion of the semiconductor device illustrated in FIG. 4A.

FIG. 5A is an enlarged cross-sectional diagram of a portion "A1*a*" illustrated in FIG. 4A.

Referring to FIG. 5A, in the stack structure ST, each of the gate horizontal layers 35G, 39G, and 43G may include a first gate layer 45 and a second gate layer 47. The first gate layer 45 may cover upper and lower surfaces of the second gate layer 47 and may be interposed between the second gate layer 47 and the vertical memory structure 54.

In an example embodiment, the first gate layer 45 may include a dielectric material, and the second gate layer 47 may include a conductive material. For example, the first gate layer 45 may include a high-k dielectric such as AlO, and the second gate layer 47 may include a conductive material such as TiN, WN, Ti, or W.

In another example embodiment, the first gate layer 45 may include a first conductive material (e.g., TiN or W, etc.), and the second gate layer 47 may include a second conductive material (e.g., Ti, W, etc.) different from the first conductive material.

In another example embodiment, each of the first and second gate layers 45 and 47 may be formed of doped polysilicon, a metal-semiconductor compound (e.g., TiSi, TaSi, CoSi, NiSi, or WSi), metal nitride (e.g., TiN, TaN, or WN), or metal (e.g., Ti or W).

In an example embodiment, among the gate horizontal layers 35G, 39G, and 43G, the lowermost first lower gate horizontal layer **35*g*_La may be lower erase control gate electrodes, and the second lower gate horizontal layer 35*g*_Lb on the first lower gate horizontal layer 35*g*_La may be a lower select gate electrode, e.g., a ground select gate electrode. Among the gate horizontal layers 35G, 39G, and 43G, the first upper gate horizontal layer 43*g*_Ua may be an upper select gate electrode, e.g., a string select gate electrode, and a second upper gate horizontal layer 43*g*_Ub on the first upper gate horizontal layer 43*g*_Ua may be an upper erase control gate electrode. A single first lower gate horizontal layer 35*g*_La may be provided, or the first lower gate horizontal layers 35*g*_La may be provided and stacked in the vertical direction Z. A single second upper gate horizontal layer 43*g*_Ub may be provided or multiple second upper gate horizontal layers 43*g*_Ub** may be provided and stacked in the vertical direction Z.

In an example embodiment, among the gate horizontal layers 35G, 39G, and 43G, at least a portion of the gate horizontal layers 39G and 43M disposed between the second lower gate horizontal layer **35*g*_Lb and the first upper gate horizontal layer 43*g*_Ua** may be word lines.

The vertical memory structure 54 may include an insulating core pattern 60, a channel layer 58 covering a side surface and a bottom surface of the insulating core pattern 60, a data storage structure 56 disposed on an external side surface and a bottom surface of the channel layer 58, and a pad pattern 62 in contact with the channel layer 58 on the insulating core pattern 60.

The insulating core pattern 60 may include silicon oxide. The channel layer 58 may include polysilicon. The pad pattern 62 may include at least one of doped polysilicon, metal nitride (e.g., TiN, etc.), metal (e.g., W, etc.), and a metal-semiconductor compound (e.g., TiSi, etc.).

The data storage structure 56 may include a first dielectric layer **56*a*, a second dielectric layer 56*c*, and a data storage layer 56*b* disposed between the first dielectric layer 60*a* and the second dielectric layer 6***c*. The second dielectric layer **56*c* may be in contact with the channel layer 58, and the data storage layer 56*b* may be spaced apart from the channel layer 58. The first dielectric layer 60*a* may include silicon oxide or silicon oxide doped with impurities. The second dielectric layer 56*c* may include at least one of silicon oxide and a high-k material. The data storage layer 56*b* may include regions which may store data in a semiconductor device such as a flash memory device. For example, the data storage layer 56*b*** may include a material which may trap charges, e.g., silicon nitride.

The first intermediate pattern layer 20, which may be formed of a polysilicon layer, may penetrate the data storage structure 56 and may be in contact with the channel layer 58. Thus, the data storage structure 56 may be divided into a lower portion 56L and an upper portion 56U by the first intermediate pattern layer 20.

A side surface of the vertical memory structure 54 may have an inflection portion 54V in a region in which the second upper stack structure ST_U2 is adjacent to the first lower stack structure ST_U1. For example, the vertical memory structure 54 may include a lower vertical portion 54L disposed in the first upper stack structure ST1_U1 and an upper vertical portion 54U disposed in the second upper stack structure ST_U2. A width of a lower region of the upper vertical portion 54U may be smaller than a width of an upper region of the lower vertical portion 54L. Due to the difference in width, a side surface of the vertical memory structure 54 may have a bent portion, i.e., the inflection portion 54V, in a region in which the upper vertical portion 54U is adjacent to the lower vertical portion 55L.

In an example embodiment, the vertical memory structure 54 may penetrate the upper pattern layer 23 and the first intermediate pattern layer 20 in order, and may extend into the lower pattern layer 18.

The bit line connection pattern **85*a* may be in contact with the pad pattern 62 of the vertical memory structure 54**.

Below, an example embodiment of the barrier structure 68 will now be described with reference to FIG. 5B.

Figure 5B:
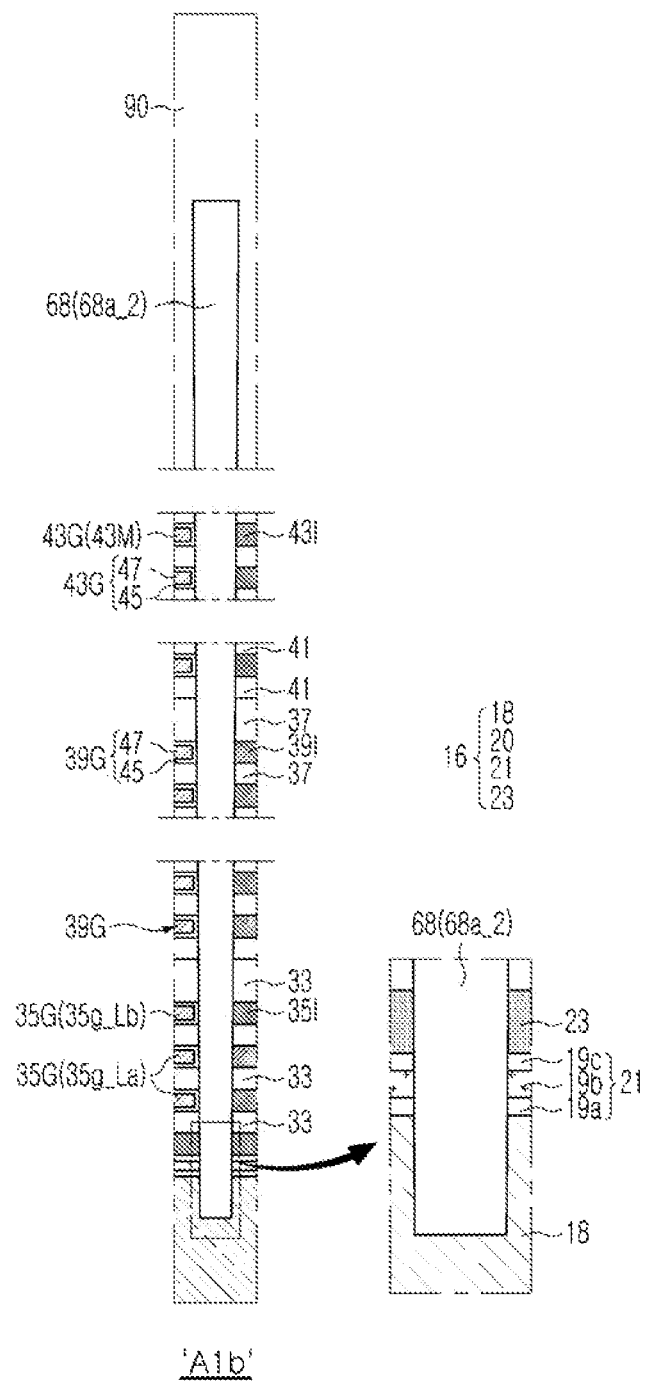
FIG. 5B is an enlarged cross-sectional diagram of a portion of the semiconductor device illustrated in FIG. 4A.

FIG. 5B is an enlarged cross-sectional diagram of a portion "A1*b*" illustrated in FIG. 4A.

Referring to FIG. 5B, among the barrier patterns of the barrier structure 68, one of the barrier patterns, e.g., the second barrier pattern **68*a*_2, may be in contact with the insulating horizontal layers 35I, 39I, and 43I of the stack structure ST and the gate horizontal layers 35G, 39G, and 43G. The barrier structure 68 may penetrate the upper pattern layer 23 and the second intermediate pattern layer 21 in order, and may extend into the lower pattern layer 18**.

In an example embodiment, the second intermediate pattern layer 21 may include a first layer **19*a*, a second layer 19*b*, and a third layer 19*c* stacked in order. The second layer 19*b* may be a polysilicon layer or a silicon nitride layer. The first and third layers 19*a* and 19*c*** may be silicon oxide layers.

In an example embodiment, the barrier structure 68 may be formed of an insulating material layer. For example, the barrier structure 68 may be formed of a silicon oxide layer. Thus, the vertical memory structure 54 (in FIG. 5A) may have a material layer having a cross-sectional structure different from that of the barrier structure 68.

Below, an example embodiment of the supporter pattern 65 will now be described with reference to FIG. 5C. The supporter pattern 65 in FIG. 5C may be disposed adjacent to the barrier structure 68 illustrated in FIG. 3.

Figure 5C:
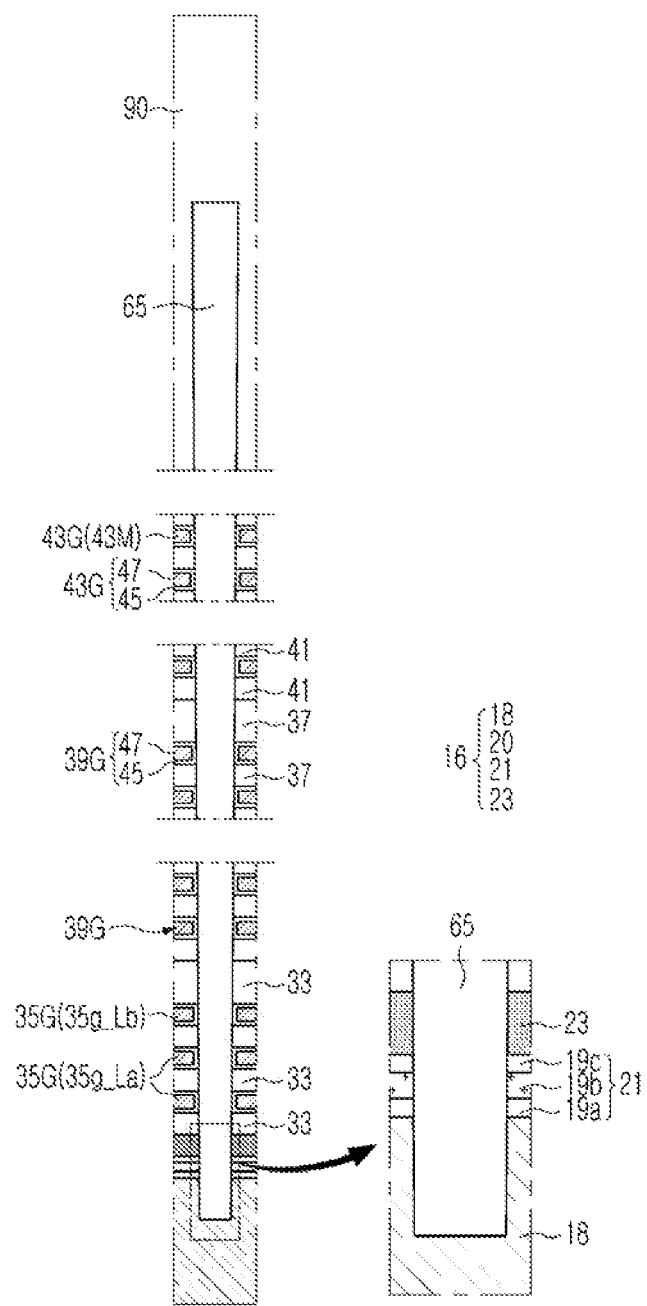
FIG. 5C is an enlarged cross-sectional diagram of a portion of the semiconductor device illustrated in FIG. 4C.

FIG. 5C is an enlarged cross-sectional diagram corresponding to the cross-sectional region illustrated in FIG. 5B.

Referring to FIG. 5C, the supporter pattern 65 may penetrate the gate horizontal layers 35G, 39G, and 43G of the stack structure ST. The supporter pattern 65 may penetrate the upper pattern layer 23 and the second intermediate pattern layer 21 in order, and may extend into the lower pattern layer 18.

In an example embodiment, the supporter pattern 65 may be formed of the same material as that of the barrier structure 68. For example, the supporter pattern 65 and the barrier structure 68 may include silicon oxide.

In an example embodiment, the supporter pattern 65 and the barrier structure 68 may be formed at the same time. Thus, the supporter pattern 65 and the barrier structure 68 may have upper surfaces disposed on the same level.

Below, an example embodiment of the peripheral through contact plug 80 will now be described with reference to FIG. 5D.

Figure 5D:
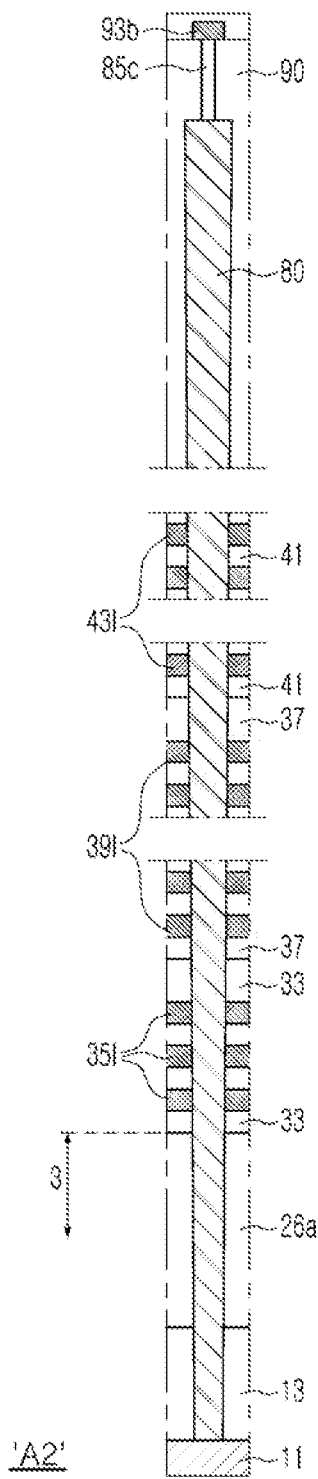
FIG. 5D is an enlarged cross-sectional diagram of a portion of the semiconductor device illustrated in FIG. 4B.

FIG. 5D is an enlarged cross-sectional diagram of a portion "A2" illustrated in FIG. 4B.

Referring to FIG. 5D, the peripheral through contact plug 80 may penetrate the insulating horizontal layers 35I, 39I, and 43I of the multilayer structure ST, may extend downwardly, and may be electrically connected to the peripheral circuit 7 of the peripheral pad 11.

An example embodiment of the second lower gate horizontal layer 35g_Lb, which may be the upper select gate electrode described in FIG. 5A, e.g., a ground select gate electrode, will now be described with reference to FIG. 6A.

Figure 6A:
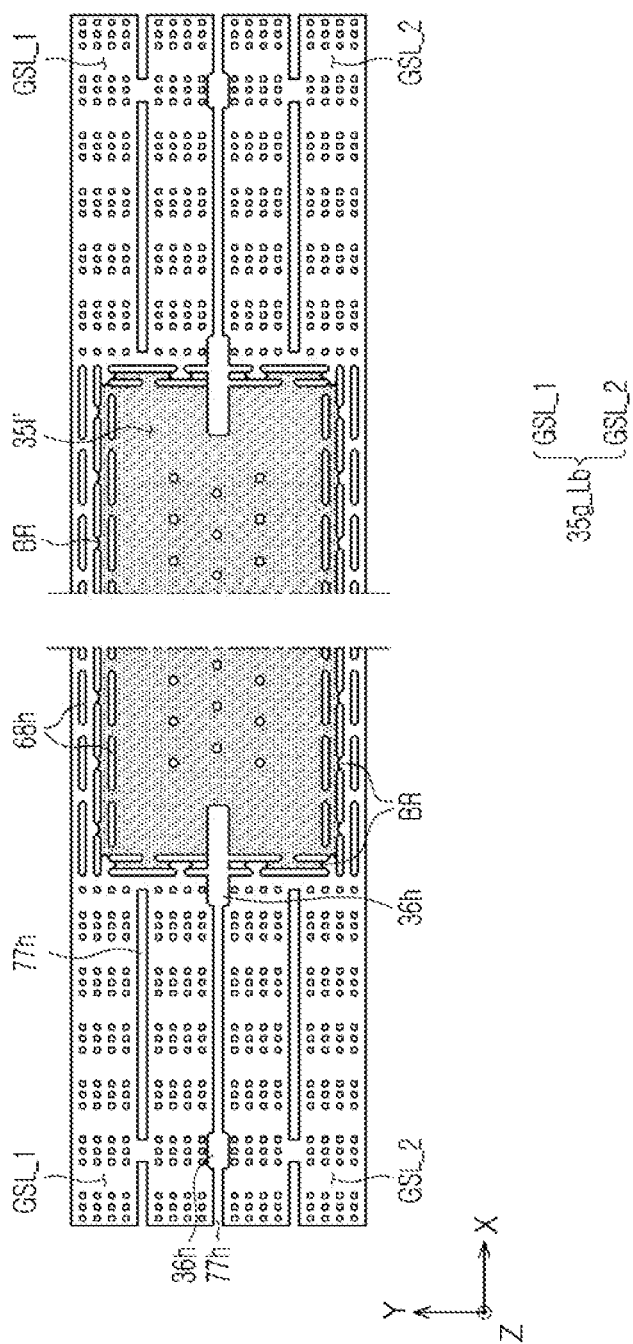
FIGS. 6A and 6B are plan diagrams of a portion of the elements illustrated in FIG. 3.

FIG. 6A illustrates the second lower gate horizontal layer 35g_Lb and the insulating horizontal layer 35I' connected to the second lower gate horizontal layer 35g_Lb in a position corresponding to the plan diagram in FIG. 2.

Referring to FIG. 6A, the second lower gate horizontal layer 35g_Lb may include a first ground select gate electrode layer GSL_1 and a second ground select gate electrode layer GSL_2 physically separated from each other. The first and second ground select gate electrode layers GSL_1 and GSL_2, spaced apart and electrically separated from each other, may be connected to an insulating horizontal layers 35I'.

In an example embodiment, the second lower gate horizontal layer 35g_Lb may be formed of a conductive material, and the first and second ground select gate electrode layers GSL_1 and GSL_2 may be in contact with the insulating horizontal layer 35I'.

In an example embodiment, the second lower gate horizontal layer 35g_Lb may include a first gate layer 45 (which may be a dielectric material layer) and a second gate layer 47 (which may be a conductive material layer as described in FIG. 5A), and the first gate layer 45 (an insulating layer) may be interposed between the first and second ground select gate electrode layers GSL_1 and GSL_2 and the insulating horizontal layer 35I'. Thus, the first and second ground select gate electrode layers GSL_1 and GSL_2 may be connected to the insulating horizontal layer 35I' through the first gate layer 45, which may be a dielectric material layer. Thus, in a planar shape corresponding to the example in FIG. 2, the second lower gate horizontal layer 35g_Lb may be divided into two gate horizontal layers GSL_1 and GSL_2 spaced apart from each other, and the two gate horizontal layers GSL_1 and GSL_2 spaced apart from each other may be in contact with and connected to the insulating horizontal layer 35I'. Thus, an interface BR may be formed between the two gate horizontal layers GSL_1 and GSL_2 and the insulating horizontal layer 35I'. The two gate horizontal layers GSL_1 and GSL_2, spaced apart and electrically separated from each other, may be in contact with one of the insulating horizontal layers 35I' of the first insulating stack region ST_Ia (in FIG. 1) and one of the insulating horizontal layers 35I' of the second insulating stack region ST_Ib (in FIG. 1). Thus, one of the horizontal layers of the lower stack structure ST_L, e.g., the uppermost horizontal layer 35, may include the gate horizontal layers GSL_1 and GSL_2 spaced apart from each other, the insulating horizontal layer 35I' of the first insulating stack region ST_Ia (in FIG. 1), and the insulating horizontal layer 35I' of the second insulating stack region ST_Ib (in FIG. 1).

The barrier structure 68, the supporter pattern 65, the separation structures 77, and the lower select gate separation patterns 36, described in FIG. 3, may be formed as openings 68h, 65h, 77h, and 36h that penetrate the second lower gate horizontal layer 35g_Lb. Thus, among the select gate electrode layers, the first select gate electrode layer GSL_1 may surround side surfaces of each of the first barrier patterns 68a_1 (in FIG. 3) of the first barrier structure 68a, and the second select gate electrode layer GSL_1 may surround side surfaces of each of the first barrier patterns 68b_1 of the second barrier structure 68b.

In an example embodiment, the interface BR between the two gate horizontal layers GSL_1 and GSL_2 and the insulating horizontal layer 35I' may be in contact with one of the openings 68h formed by the barrier structure 68 penetrating the second lower gate horizontal layer 35g_Lb.

Figure 6B:
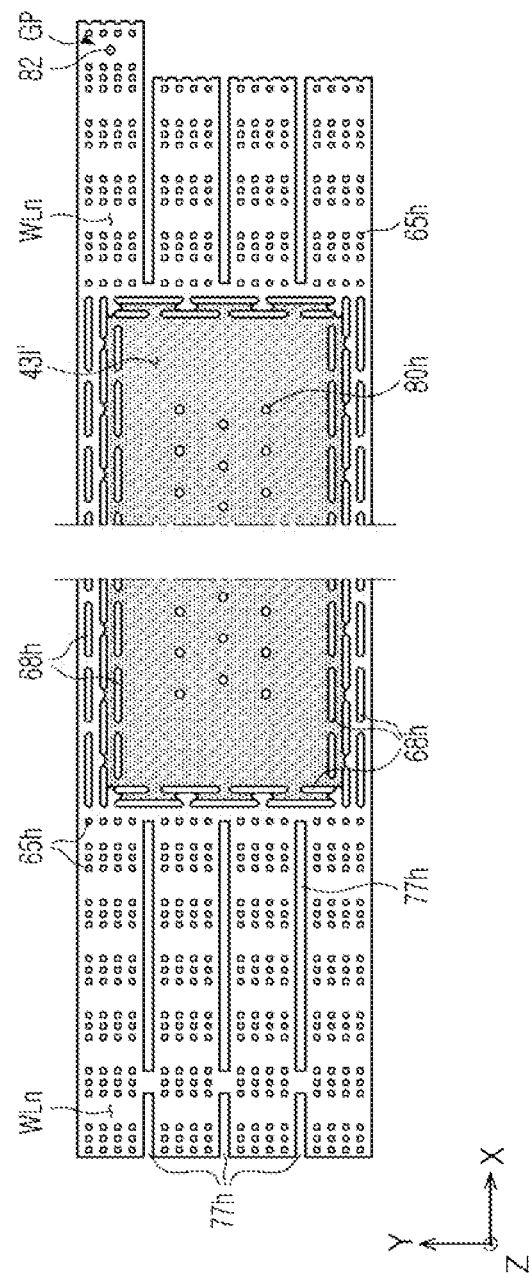

FIG. 6B illustrates a gate horizontal layer 43M (from the gate horizontal layers 39G and 43M, which may be the word lines) and one of the insulating horizontal layers 43I' in contact with and connected to the gate horizontal layer 43M. One of the gate horizontal layers 43M may be an n-th word line layer WLn.

Referring to FIG. 6B, one of the gate horizontal layers WLn may be connected to one of the insulating horizontal layers 43I', and may surround side surfaces of the insulating horizontal layer 43I'. The gate horizontal layer WLn may be disposed on a level higher than a level of the first and second ground select gate electrode layers GSL_1 and GSL_2.

In an example embodiment, the gate horizontal layer WLn may be formed of a conductive material, and the gate horizontal layer WLn (which may be a word line) may be in contact with the insulating horizontal layer 43I'.

In an example embodiment, the gate horizontal layer WLn includes the first gate layer 45 (which may be a dielectric material layer) and a second gate layer 47 (which may be a conductive material layer as described in FIG. 5A). The second gate layer 47 may be defined as a word line, and the first gate layer 45 may be interposed between the word line and the insulating horizontal layer 43I'.

The barrier structure 68, the supporter pattern 65, and the separation structures 77, illustrated in FIG. 3 may be openings 68h, 65h, and 77h penetrating the gate horizontal layer WLn.

In an example embodiment, the interface BR between the gate horizontal layer WLn and the insulating horizontal layer 43I' may be in contact with one of the openings 68h formed by the penetration of the barrier structure 68.

The gate horizontal layer WLn may have the gate pad region GP on an end in the first direction X. The gate pad region GP may be electrically connected to the gate contact plug 82.

Thus, one of the gate horizontal layers (i.e., one of the word line layers WLn) may overlap the two gate horizontal layers GSL_1 and GSL_2, which may be ground select gate electrodes, in the vertical direction Z.

In an example embodiment, one of the gate horizontal layers 39G is a word line disposed in a lower region of the first upper stack structure ST_U1. In this case, the insulating horizontal layer 39I of the horizontal layer 39 may include the insulating horizontal layer 39I of the first insulating stack region ST_Ia (in FIG. 1) and the insulating horizontal layer 39I of the second insulating stack region ST_Ib (FIG. 1).

In an example embodiment, one of the gate horizontal layers is a word line disposed in an upper region of the first upper stack structure ST_U1 or the second upper stack structure ST_U1. In this case, the horizontal layer 39 or 43 including the word line may include a word line layer WLn and an insulating horizontal layer 39I or 43I of the first insulating stack region ST_Ia (FIG. 1). Thus, among the horizontal layers 35, 39, and 43 disposed between the first main separation structure 77m1 and the second main separation structure 77m2, the first horizontal layer 35 disposed on a first level may include gate horizontal layers GSL_1 and GSL_2 (in FIG. 6A) (which may be select gate electrodes), the insulating horizontal layer 35I (in FIG. 4A) of the first insulating stack region ST_Ia (in FIG. 1), and the insulating horizontal layer 35I (in FIG. 4A) of the second insulating layer stack region ST_Ib (in FIG. 1). The second horizontal layer disposed on a second level higher than the first level may include the gate horizontal layer 39G (the gate horizontal layer 39G disposed in a lower region among the gate horizontal layers 39G in FIG. 4A) (which may be one of the first word lines), the insulating horizontal layer 39I (in FIG. 4A) of the first insulating stack region ST_Ia (in FIG. 1), and the insulating horizontal layer 39I (in FIG. 4A) of the second insulating stack region ST_Ib (in FIG. 4A). The third horizontal layer 43 disposed on a third level higher than the second level may include the gate horizontal layer 43G (the gate horizontal layer 43G which may be a word line among the gate horizontal layers 43G in FIG. 4A) (which may be one of the second word lines), the insulating horizontal layer 43I (in FIG. 4A) of the first insulating stack region ST_Ia (in FIG. 1), and the insulating horizontal layer 43I (in FIG. 4A) of the second insulating stack region ST_Ib (in FIG. 1).

Below, a modified example of the interface surfaces BR in contact with the insulating horizontal layers of the insulating stack region ST_I and the gate horizontal layers of the gate stack region ST_G described in FIG. 3 will now be described with reference to FIGS. 7A to 7C.

Figure 7A:
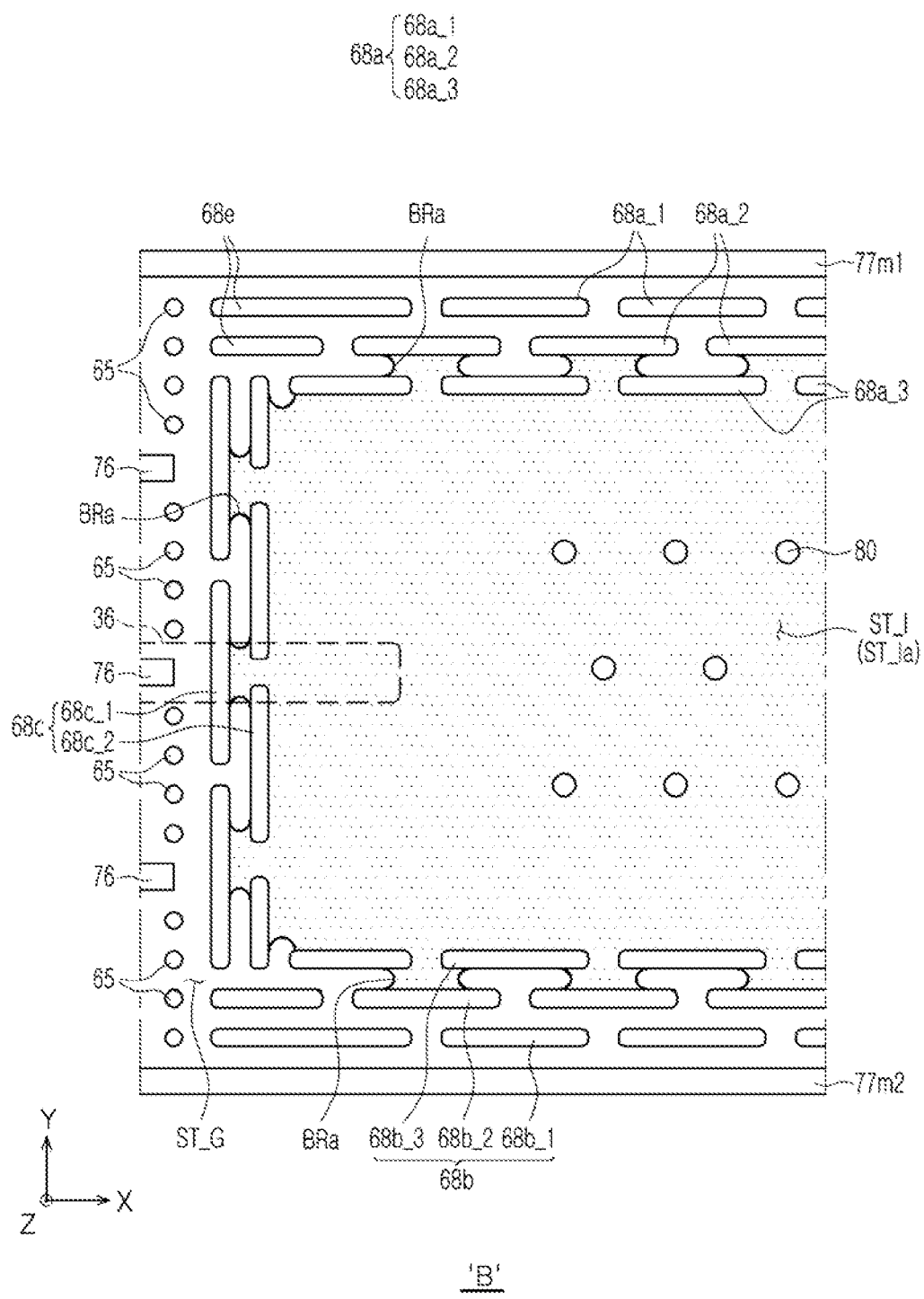
FIGS. 7A to 7C are enlarged plan diagrams of a portion of a modified example of a semiconductor device according to an example embodiment.
Figure 7B:
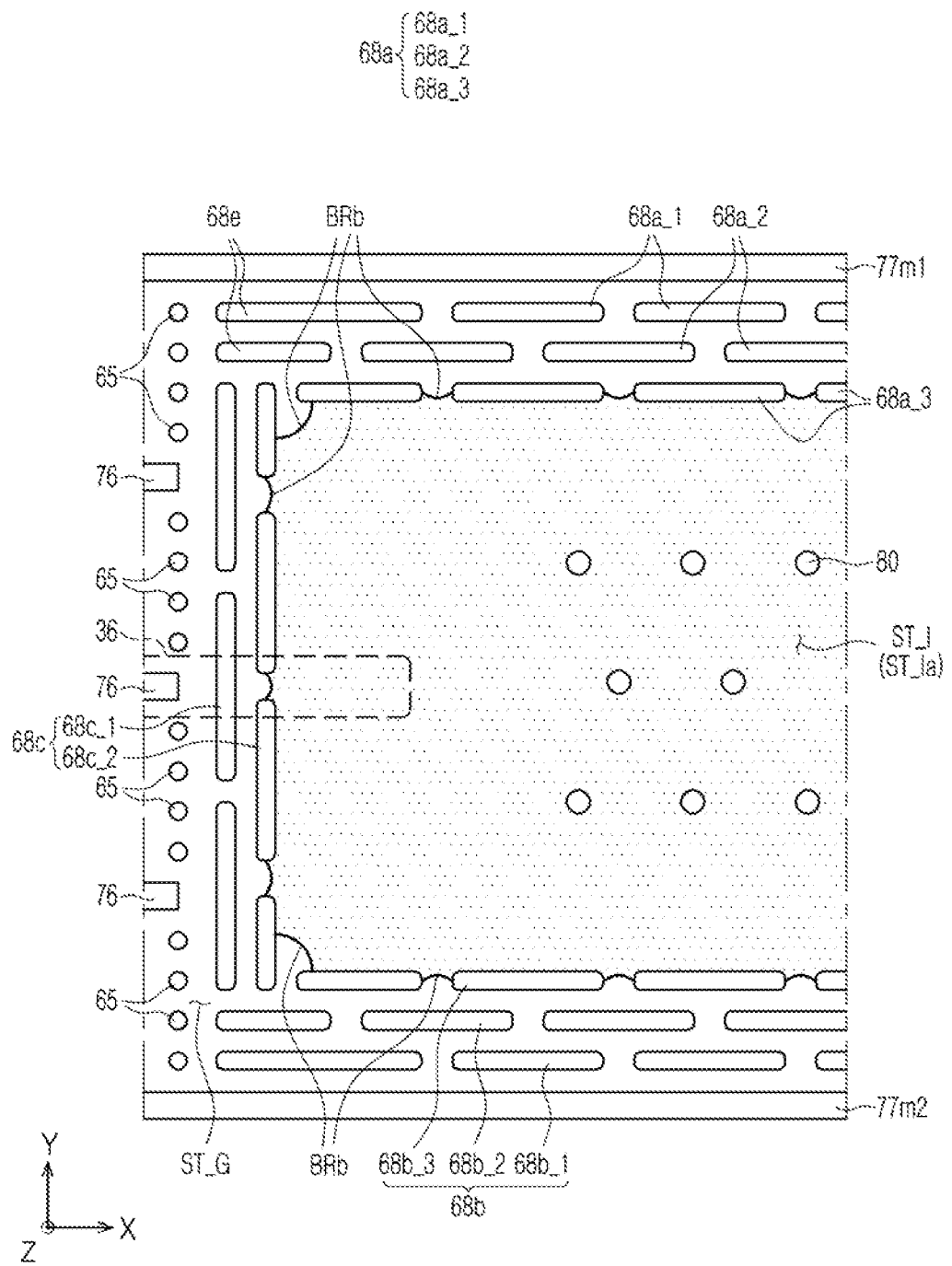
Figure 7C:
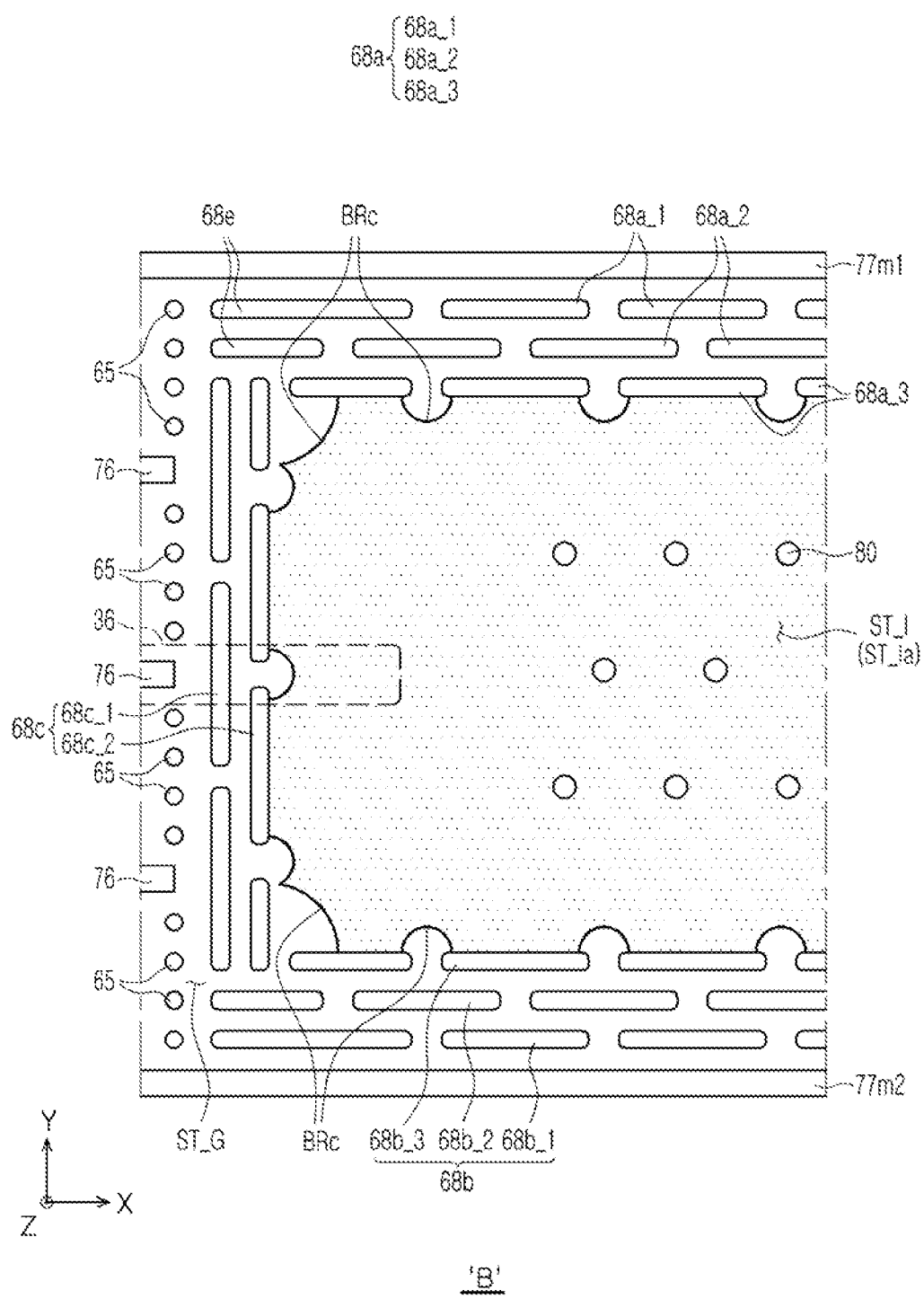

FIGS. 7A to 7C are enlarged plan diagrams of a portion of a modified example of a semiconductor device according to an example embodiment.

In the modified example, referring to FIG. 7A, boundary surfaces Bra (which are in contact with the insulating horizontal layers of the insulating stack region ST_I and the gate horizontal layers of the gate stack region ST_G) may be disposed between the second barrier patterns 68a_2 of the first barrier structure 68a and the first inner barrier patterns 68a_3.

In another modified example, referring to FIG. 7B, boundary surfaces BRb (which are in contact with the insulating horizontal layers of the insulating stack region ST_I and the gate horizontal layers of the gate stack region ST_G) may be disposed between adjacent ones of the first inner barrier patterns 68a_3.

In another modified example, referring to FIG. 7C, boundary surfaces BRc (which are in contact with the insulating horizontal layers of the insulating stack region ST_I and the gate horizontal layers of the gate stack region ST_G) may be in contact with side surfaces of adjacent ones of the first inner barrier patterns 68a_3, and may be concave towards the through contact plugs 80.

In an example embodiment, the gate horizontal layers of the gate stack region ST_G may fill a region between the barrier patterns of the barrier structure 68, may penetrate the barrier structure 68, and may protrude in a direction towards the through contact plugs 80 from the barrier structure 68.

Below, various modified examples of the barrier structure 68 described in FIG. 3 will now be described with reference to FIGS. 8A to 8E.

FIGS. 8A to 8E are enlarged plan diagrams of a portion of a modified example of a semiconductor device according to an example embodiment.

Figure 8A:
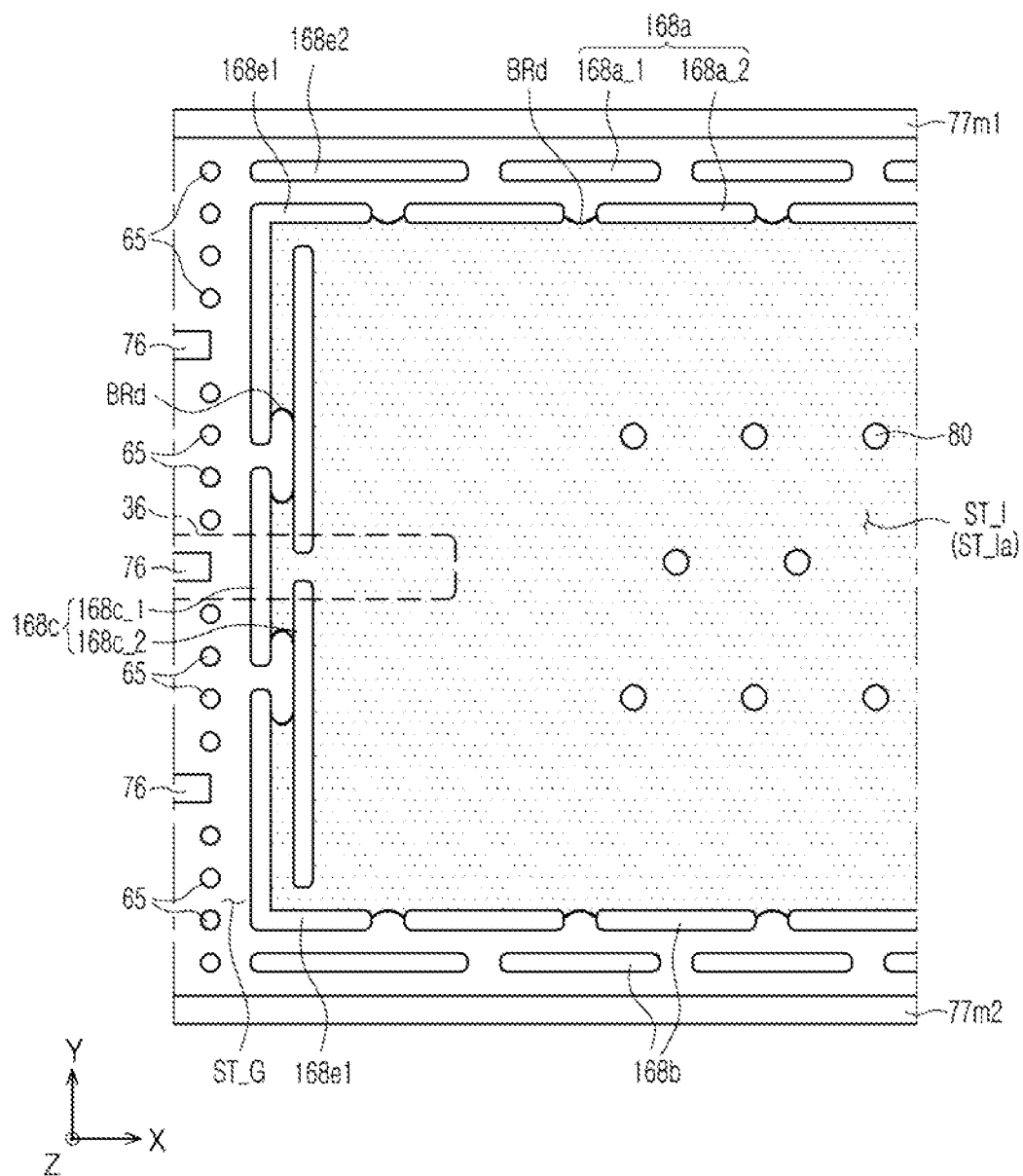
FIGS. 8A to 8E are enlarged plan diagrams of a portion of a modified example of a semiconductor device according to an example embodiment.

In a modified example, referring to FIG. 8A, a first barrier structure 168a may include first barrier patterns 168a_1 and second barrier patterns 168a_2 corresponding to the first barrier patterns 68a_1 and the second barrier patterns 68a_2 of the first barrier structure 68a described in FIG. 3, respectively.

A second barrier structure 168b may be mirror-symmetrical with the first barrier structure 168a. A third barrier structure 168c may include a first barrier pattern 168c_1 (having a bar shape extending in the second direction Y) and a second barrier patterns 168c_2 (having a bar shape extending in the second direction Y and arranged in a zigzag pattern with the first barrier pattern 168c_1).

One of edge barrier patterns 168e1 among the edge barrier patterns 68e described in FIG. 3 may be connected to one of the barrier patterns of the third barrier structure 168c, and other edge barrier pattern 168e2 may be spaced apart from the third barrier structure 168c.

Boundary surfaces BRd (which are in contact with the insulating horizontal layers of the insulating stack region ST_I and the gate horizontal layers of the gate stack region ST_G) may be in contact with the first to third barrier structures 168a, 168b, and 168c.

Figure 8B:
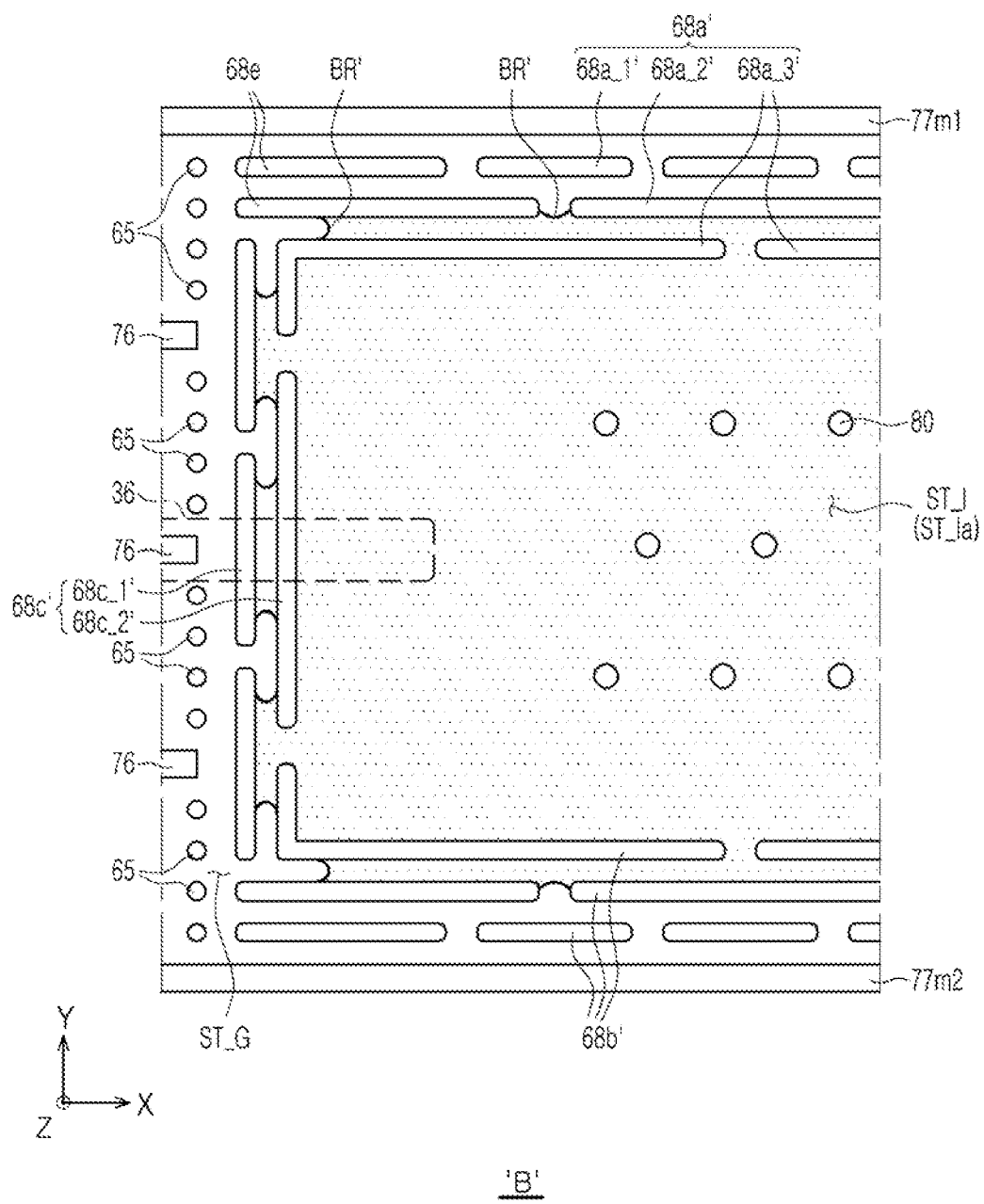

In a modified example, referring to FIG. 8B, a first barrier structure 68a' may include first barrier patterns 68a_1', second barrier patterns 68a_2', and first inner barrier patterns 68a_3' corresponding to the first barrier patterns 68a_1, the second barrier patterns 68a_2, and the first inner barrier patterns 68a_3 of the first barrier structure 68a, respectively. Each of the second barrier patterns 68a_2' and the first inner barrier patterns 68a_3' may have a length greater than the length of each of the first barrier patterns 68a_1'.

A second barrier structure 68b' may be mirror-symmetrical with the first barrier structure 68a'. A third barrier structure 68c' may include the first barrier pattern 168c_1 (having a bar shape extending in the second direction Y) and the second barrier patterns 168c_2 (having a bar shape extending in the second direction Y and arranged in a zigzag pattern with the first barrier pattern 168c_1).

Boundary surfaces BR' (which are in contact with the insulating horizontal layers of the insulating stack region ST_I and the gate horizontal layers of the gate stack region ST_G) may be in contact with the first to third barrier structures 68a', 68b', and 68c'.

Figure 8C:
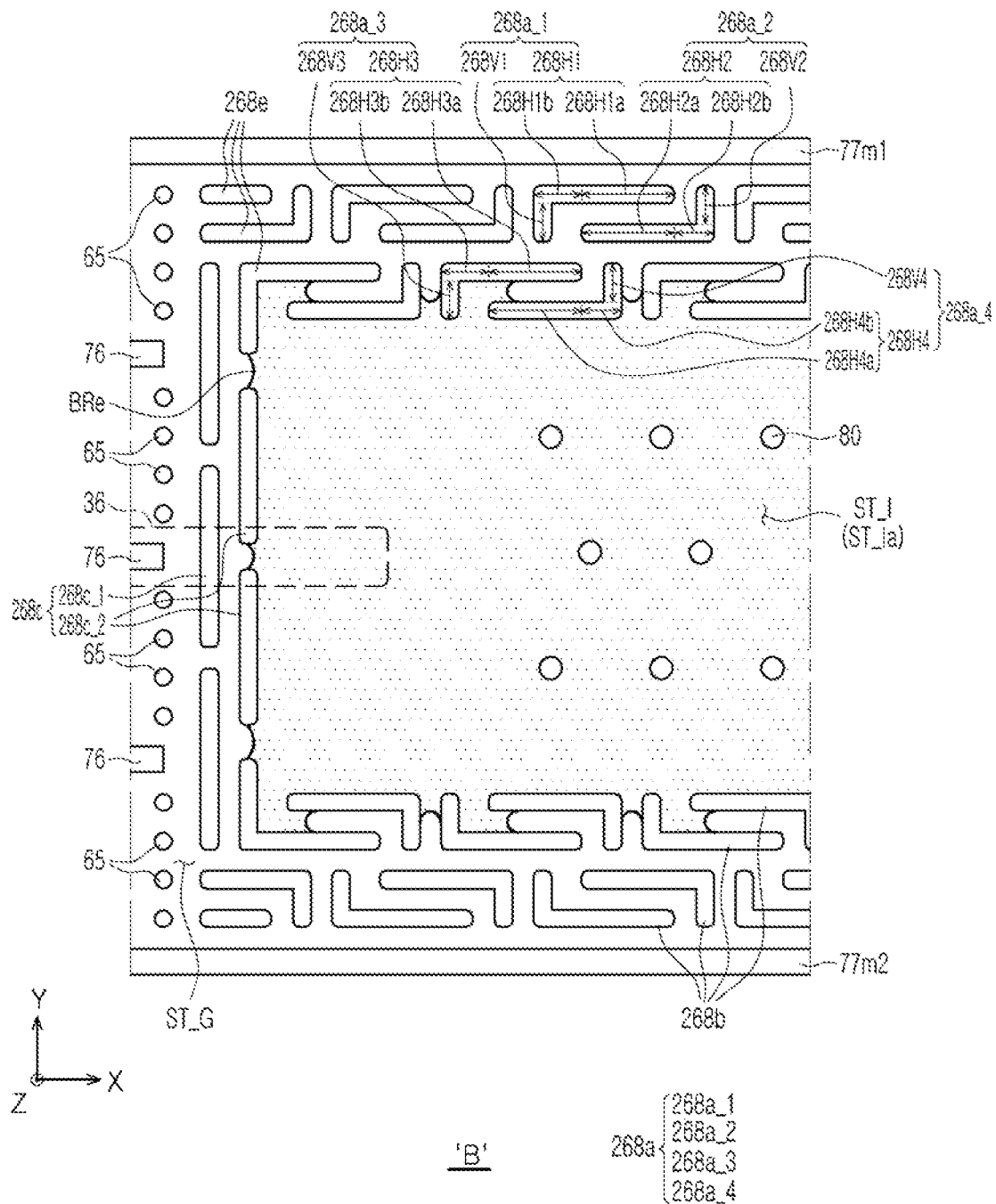

In a modified example, referring to FIG. 8C, a first barrier structure 268a may include first barrier patterns 268a_1 arranged in the first direction X, second barrier patterns 268a_2 arranged in the first direction X, third barrier patterns 268a_3 arranged in the first direction X, and fourth barrier patterns 268a_4 arranged in the first direction X.

A spacing between the first barrier patterns 268a_1 and the first main separation structure 77m1 may be substantially the same as a spacing between the second barrier patterns 268a_2 and the first main separation structure 77m1. A spacing between the third barrier patterns 268a_3 and the first main separation structure 77m1 may be substantially the same as a spacing between the fourth barrier patterns 268a_4 and the first main separation structure 77m1. A spacing between the first barrier patterns 268a_1 and the first main separation structure 77m1 may be smaller than a spacing between the third barrier patterns 268a_3 and the first main separation structure 77m1.

In the first barrier pattern 268a_1 and the second barrier pattern 268a_2 adjacent to each other, the first barrier pattern 268a_1 may include a first horizontal portion 268H1 having a bar shape extending in the first direction X and a second horizontal portion 268V1 extending from a portion of the first horizontal portion 268H1 in the second direction Y to be spaced apart from the first main separation structure 77m1. The first horizontal portion 268H1 may include a first portion 268H1a opposing the second barrier pattern 268a_2 in the second direction Y and a second portion 268H1b which does not oppose the second barrier pattern 268a_2 in the second direction Y. The second horizontal portion 268V1 may extend from the second portion 268H1b.

The second barrier pattern 268a_2 may include a first horizontal portion 268H2 having a bar shape extending in the first direction X and a second horizontal portion 268V2 extending in the second direction Y towards the first main separation structure 77m1 from a portion of the first horizontal portion 268H2. The first horizontal portion 268H2 may include a first portion 268H2a opposing the first barrier pattern 268a_1 in the second direction Y and a second portion 268H2b which does not oppose the first barrier pattern 268a_1 in the second direction Y. The second horizontal portion 268V2 may extend from the second portion 268H2b.

In the third barrier pattern 268a_3 and the fourth barrier pattern 268d_2 adjacent to each other, the third barrier pattern 268a_3 may include a first horizontal portion 268H3 having a bar shape extending in the first direction X and a second horizontal portion 268V3 extending from a portion of the first horizontal portion 268H3 in the second direction Y to be spaced apart from the first main separation structure 77m1. The first horizontal portion 268H3 may include a first portion 268H3a opposing the fourth barrier pattern 268a_4 in the second direction Y and a second portion 268H3b which does not oppose the fourth barrier pattern 268a_4 in the second direction Y. The second horizontal portion 268V3 may extend from the second portion 268H3b.

The fourth barrier pattern 268d_2 may include a first horizontal portion 268H4 having a bar shape extending in the first direction X and a second horizontal portion 268V4 extending in the second direction Y towards the first main separation structure 77m1 from a portion of the first horizontal portion 268H4. The first horizontal portion 268H4 may include a first portion 268H4a opposing the third barrier pattern 268a_3 in the second direction Y and a second portion 268H4b which does not oppose the first barrier pattern 268a_3 in the second direction Y. The second horizontal portion 268V4 may extend from the second portion 268H4b.

The second horizontal portion 268V1 of the first barrier pattern 268a_1 may oppose the first portion 268H3a of the third barrier pattern 268a_3. The second horizontal portion 268V4 of the fourth barrier pattern 268a_4 may oppose the first portion 268H2a of the second barrier pattern 268a_2.

A second barrier structure 268b may be mirror-symmetrical with the first barrier structure 268a. A third barrier structure 268c may include first and second barrier patterns 268c_1 and 268c_2, corresponding to the first and second barrier patterns 68c_1 and 68c_2 of the third barrier structure 68c described in FIG. 3, respectively.

At least one of edge barrier patterns 268e disposed in the first direction X on the edge of the first barrier structure 168a may be connected to at least one of the first and second barrier patterns 268c_1 and 268c_2 of the third barrier structure 268c.

Boundary surfaces BRe (which are in contact with the insulating horizontal layers of the insulating stack region ST_I and the gate horizontal layers of the gate stack region ST_G) may be in contact with the first to third barrier structures 268a, 268b, and 268c.

Figure 8D:
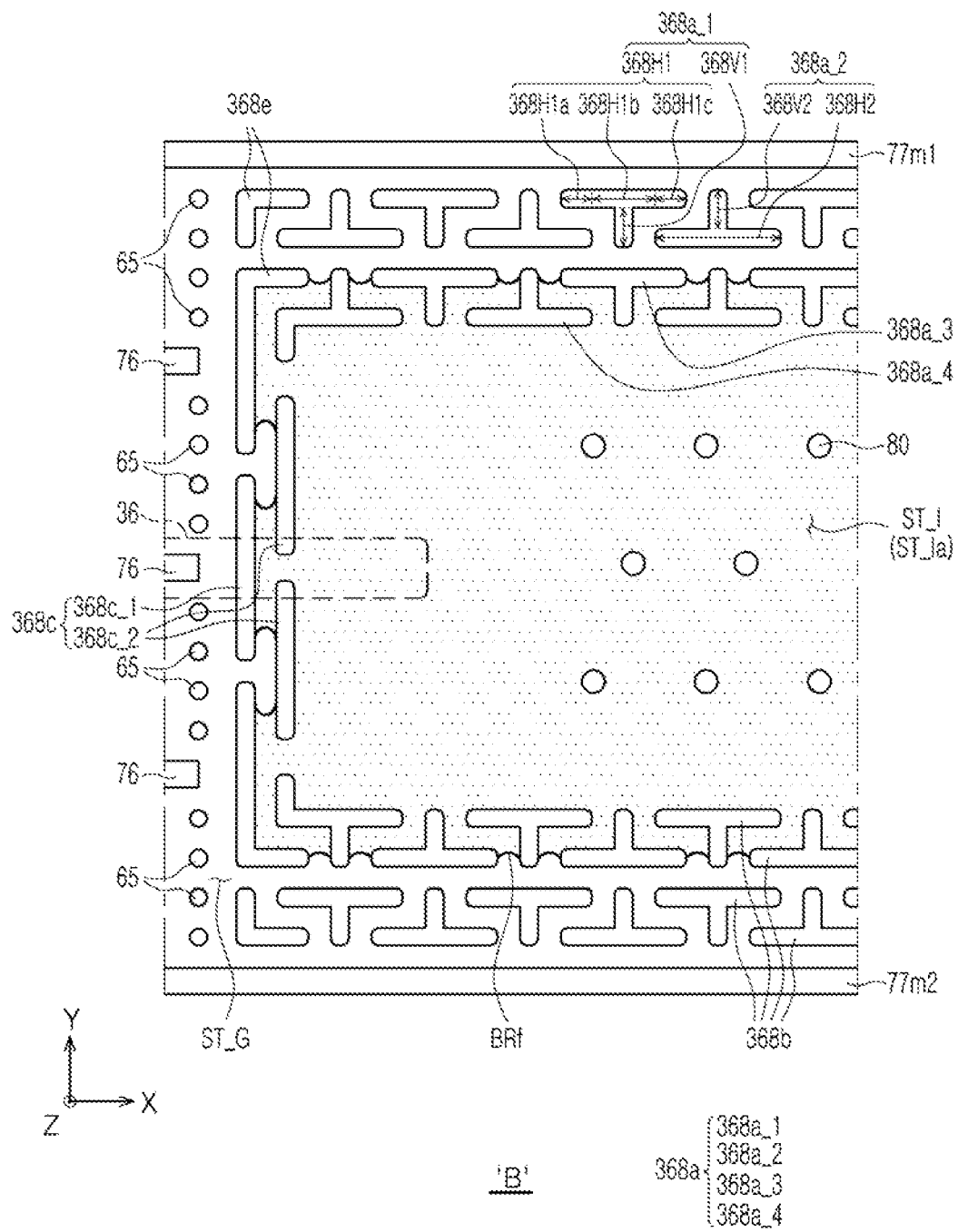

In a modified example, referring to FIG. 8D, a first barrier structure 368a may include first barrier patterns 368a_1 arranged in the first direction X, second barrier patterns 368a_2 arranged in the first direction X, third barrier patterns 368a_3 arranged in the first direction X, and fourth barrier patterns 368a_4 arranged in the first direction X.

A spacing between the first barrier patterns 368a_1 and the first main separation structure 77m1 may be substantially the same as a spacing between the second barrier patterns 368a_2 and the first main separation structure 77m1. A spacing between the third barrier patterns 368a_3 and the first main separation structure 77m1 may be substantially the same as a spacing between the fourth barrier patterns 368a_4 and the first main separation structure 77m1. A spacing between the first barrier patterns 368a_1 and the first main separation structure 77m1 may be smaller than a spacing between the third barrier patterns 368a_3 and the first main separation structure 77m1.

One of the first barrier patterns 368a_1 may include a first horizontal portion 368H1 having a bar shape extending in the first direction X and a second horizontal portion 368V1 extending from a portion of the first horizontal portion 368H1 in the second direction Y to be spaced apart from the first main separation structure 77m1. The first horizontal portion 368H1 may include a first portion 368H1a and a third portion 368H1c opposing the second barrier patterns 368a_2 in the second direction Y, and a second portion 368H1b which does not oppose the second barrier patterns 368a_2 in the second direction Y. The second horizontal portion 368V1 may extend from the second portion 368H1b. The second portion 368H1b may be disposed between the first portion 368H1a and the third portion 368H1c.

One of the second barrier patterns 368a_2 may include a first horizontal portion 368H2 having a bar shape extending in the first direction X and a second horizontal portion 368V2 extending in the second direction Y towards the first main separation structure 77m1 from a portion of the first horizontal portion 368H2. The first horizontal portion 368H2 may include a first portion 368H2a and a third portion 368H2c opposing the first barrier patterns 368a_1 in the second direction Y, and a second portion 368H2b which does not oppose the first barrier patterns 368a_1 in the second direction Y. The second horizontal portion 368V2 may extend from the second portion 368H2b. The second portion 368H2b may be disposed between the first portion 368H2a and the third portion 368H2c.

The third barrier patterns 368a_3 may have the same shape as that of the first barrier patterns 368a_1, and the fourth barrier patterns 368a_4 may have the same shape as that of the second barrier patterns 368a_2.

A second barrier structure 368b may be mirror-symmetrical with the first barrier structure 368a. A third barrier structure 368c may include first and second barrier patterns 368c_1 and 368c_2 corresponding to the first and second barrier patterns 68a_3 and 68c_2 of the third barrier structure 68c described in FIG. 3, respectively.

At least one of the edge barrier patterns 368e disposed in the first direction X on the edge of the first barrier structure 368a may be connected to at least one of the first and second barrier patterns 368c_1 and 368c_2 of the third barrier structure 368c.

Boundary surfaces BRf in contact with the insulating horizontal layers of the insulating stack region ST_I and the gate horizontal layers of the gate stack region ST_G may be in contact with the first to third barrier structures 368a, 368b, and 368c.

Figure 8E:
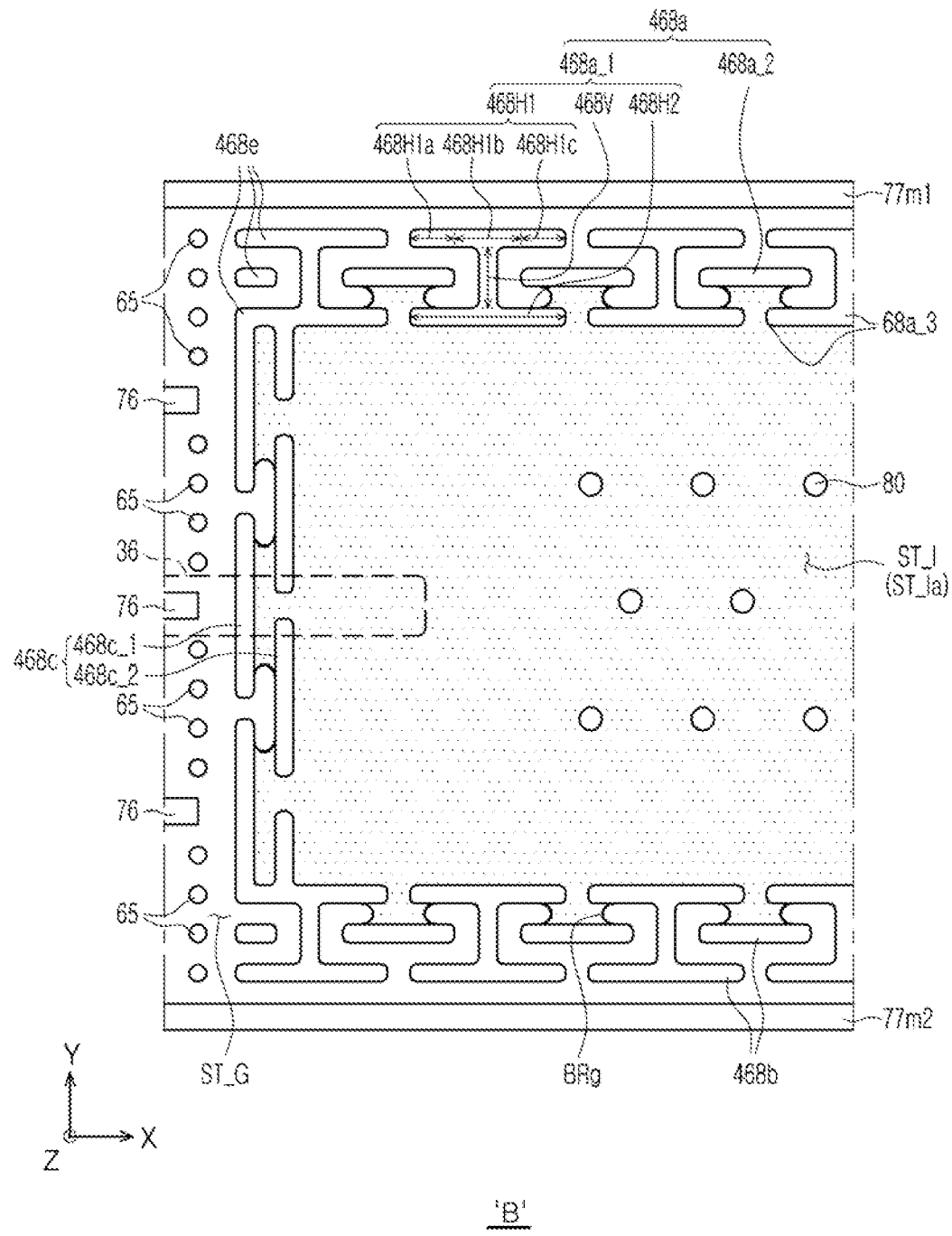

In a modified example, referring to FIG. 8E, a first barrier structure 468a may include first barrier patterns 468a_1 arranged in the first direction X and second barrier patterns 468a_2 arranged in the first direction X.

One of the first barrier patterns 468a_1 may include first horizontal portions 468H1 and 468H2 having a bar shape and parallel to each other and a second horizontal portion 468V connecting the first horizontal portions 468H1 and 468H2 to each other.

The first horizontal portions 468H1 and 468H2 may have a bar shape extending in the first direction X and may be spaced apart in the second direction Y. The second horizontal portion 468V may have a bar shape extending in the second direction Y from central portions of the first horizontal portions 468H1 and 468H2.

The second barrier patterns 468a_2 may have a bar shape including a first portion which does not oppose the first barrier patterns 468a_1 and a second portion extending to a region between the first horizontal portions 468H1 and 468H2 and opposing the second horizontal portion 468V.

Each of the first horizontal portions 468H1 and 468H2 may include first and third portions 468H1a and 468H3 opposing the second barrier patterns 468a_2, and a second portion 468H2 which does not oppose the second barrier patterns 468a_2 and is disposed between the first and third portions 468H1a and 468H3. The second horizontal portion 468V may extend from the second portion 468H2.

The second barrier structure 468b may be mirror-symmetrical with the first barrier structure 468a. The third barrier structure 468c may include first and second barrier patterns 468a_3 and 468c_2 corresponding to the first and second barrier patterns 68a_3 and 68c_2 of the third barrier structure 68c described in FIG. 3, respectively.

At least one of the edge barrier patterns 468e disposed in first direction X on the edge of the first barrier structure 468a may be connected to at least one of the first and second barrier patterns 468c_1 and 468c_2 of the third barrier structure 468c.

Boundary surfaces BRg (which are in contact with the insulating horizontal layers of the insulating stack region ST_I and the gate horizontal layers of the gate stack region ST_G) may be in contact with the first to third barrier structures 468a, 468b, and 468c.

Below, a modified example of the planar shape illustrated in FIG. 2 will now be described with reference to FIG. 9.

Figure 9:
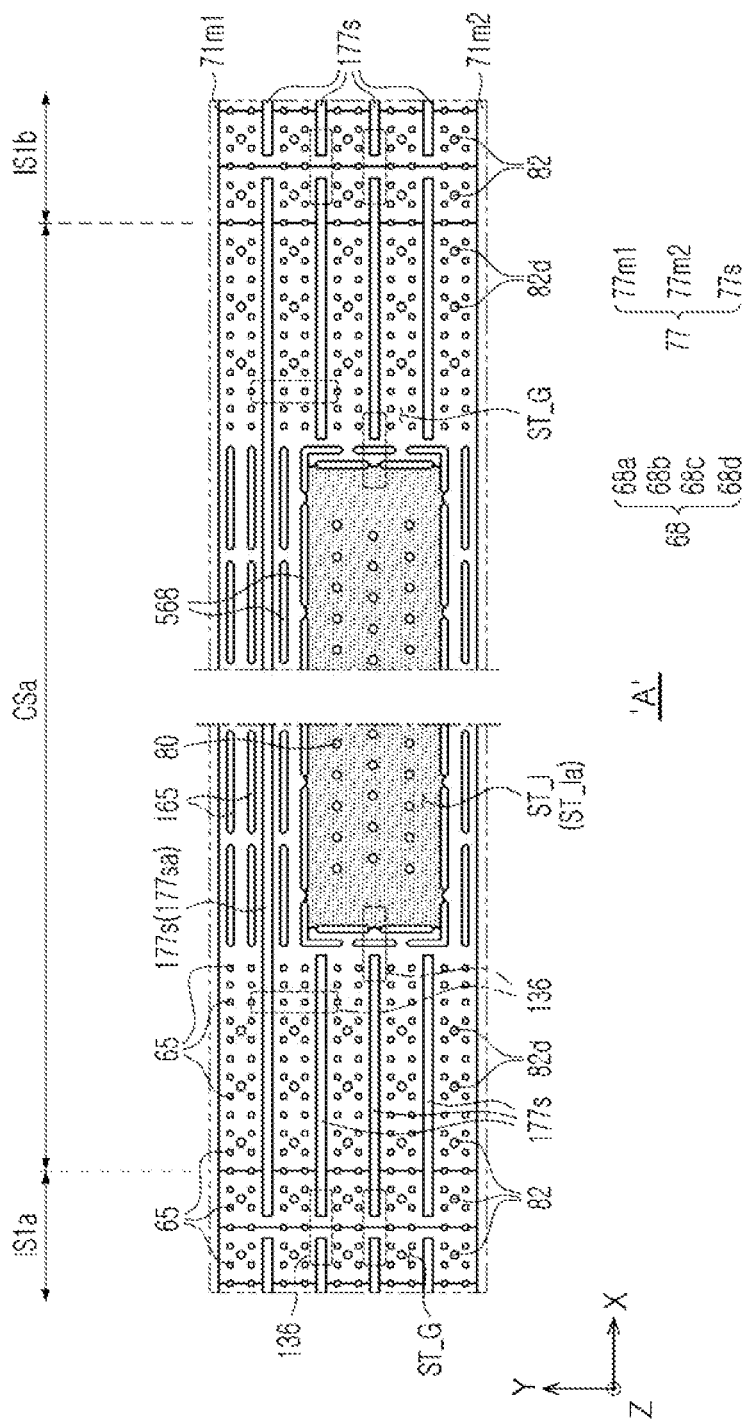
FIG. 9 is an enlarged plan diagram of a portion of a modified example of a semiconductor device according to an example embodiment.

FIG. 9 is a plan diagram corresponding to the plan diagram in FIG. 2.

Referring to FIG. 9, auxiliary separation structures 177s may be disposed between the first and second main separation structures 77m1 and 77m2. The gate stack region ST_G and an insulating stack region ST_I surrounded by the gate stack region ST_G may be disposed between the first and second main separation structures 77m1 and 77m2.

One of the auxiliary separation structures 177s may extend to a region between the insulating stack region ST_I and the first main separation structure 77m1. The other auxiliary separation structures 177s may have ends opposing the insulating stack region ST_I.

A barrier structure 568 may be disposed between a first auxiliary separation structure 177sa and the second main separation structure 77m2. The barrier structure 568 may be the same as one of the barrier structures having various shapes as described in FIGS. 2 and 8A to 8E.

Additional supporter patterns 165 may be disposed between the first auxiliary separation structure 177sa and the first main separation structure 77m1. Each of the additional supporter patterns 165 may have a bar shape extending in the first direction X. Each of the additional supporter patterns 165 may have a length greater than a width of each of the supporter patterns 65 in the first direction X.

Similar to the lower select gate separation patterns 36 described in FIGS. 2 and 3, lower select gate separation patterns 136 (which may divide the gate horizontal layer 35G, i.e., a lower select gate line among the gate horizontal layers 35G, 39G, and 43G, into three layers) may be disposed. One of the lower select gate separation patterns 136 may overlap an end of one of the auxiliary separation structures 177s, i.e., an auxiliary separation structure disposed in the central portion, and may extend to the insulating stack region ST_I. The lower select gate separation patterns 136 may be disposed on a level lower than that of the gate horizontal layers 39G and 43G, which may be word lines, among the gate horizontal layers 35G, 39G, and 43G.

An example embodiment of the second lower gate horizontal layer 35g_Lb, which may be the ground select gate electrode described with reference to FIG. 5A, will now be described with reference to FIG. 10.

Figure 10:
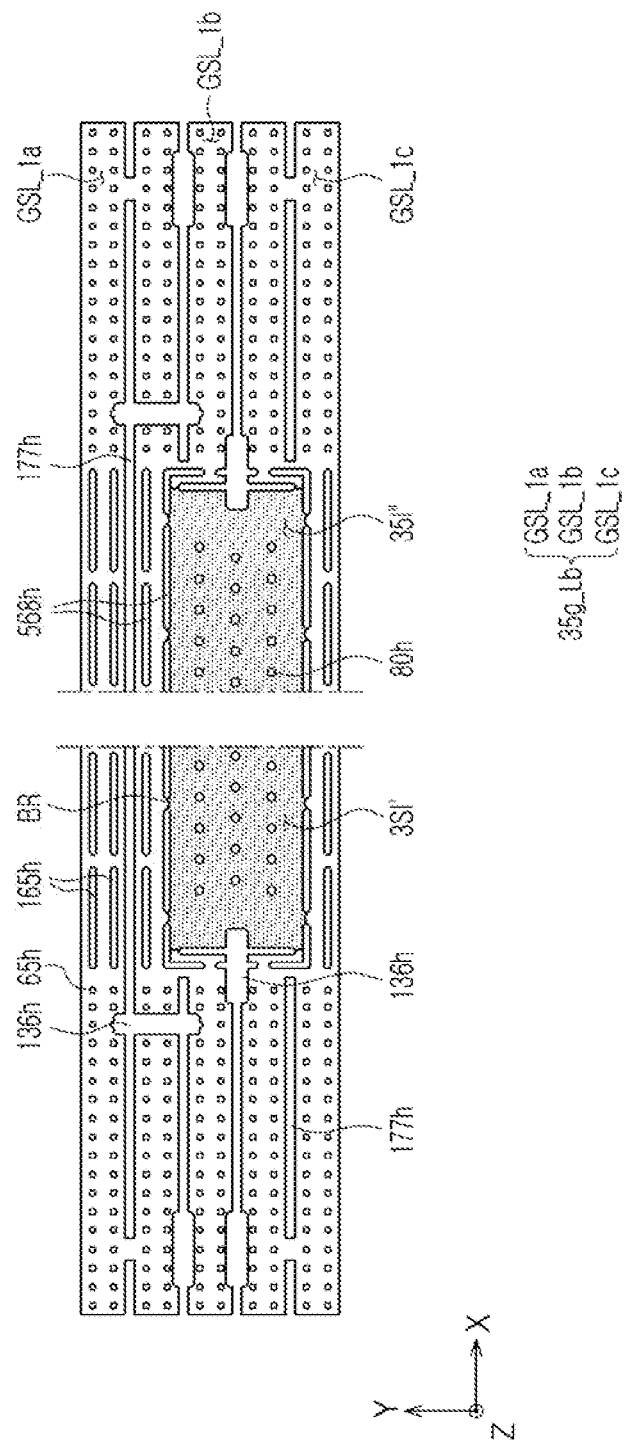
FIGS. 10 and 11 are plan diagrams of a portion of the elements illustrated in FIG. 9.

FIG. 10 illustrates an insulating horizontal layer 35I' connected to the second lower gate horizontal layer 35g_Lb and the second lower gate horizontal layer 35g_Lb in a position corresponding to the example in the plan diagram in FIG. 9.

Referring to FIG. 10, the second lower gate horizontal layer 35g_Lb may include a first ground select gate electrode GSL_1a, a second ground select gate electrode GSL_1b, and a third ground select gate electrode GSL_1c, which may be physically separated from each other. The second and third ground select gate electrodes GSL_1b and GSL_1c (spaced apart and separated from each other) may be connected to an insulating horizontal layer 35I". The first ground select gate electrode GSL_1a may be spaced apart from the insulating horizontal layer 35I".

In an example embodiment, the second lower gate horizontal layer 35g_Lb may be formed of a conductive material. In this case, the second and third ground select gate electrodes GSL_1b and GSL_1c may be in contact with the insulating horizontal layer 35I".

In an example embodiment, the second lower gate horizontal layer 35g_Lb includes the first gate layer 45 (which may be a dielectric material layer(and the second gate layer 47 (which may be a conductive material layer as described in FIG. 5A). The first gate layer 45 may be interposed between the second and third ground select gate electrodes GSL_1b and GSL_1c and the insulating horizontal layer 35I". Thus, the second and third ground select gate electrodes GSL_1b and GSL_1c may be connected to the insulating horizontal layer 35I" through the first gate layer 45, which may be a dielectric material layer.

The barrier structure 568, the supporter pattern 65, the additional supporter pattern 165, the auxiliary separation structures 177s, and the lower select gate separation patterns 136 in FIG. 9 may be openings 568h, 65h, 165h, 177h, and 136h penetrating the second lower gate horizontal layer 35g_Lb.

Figure 11:
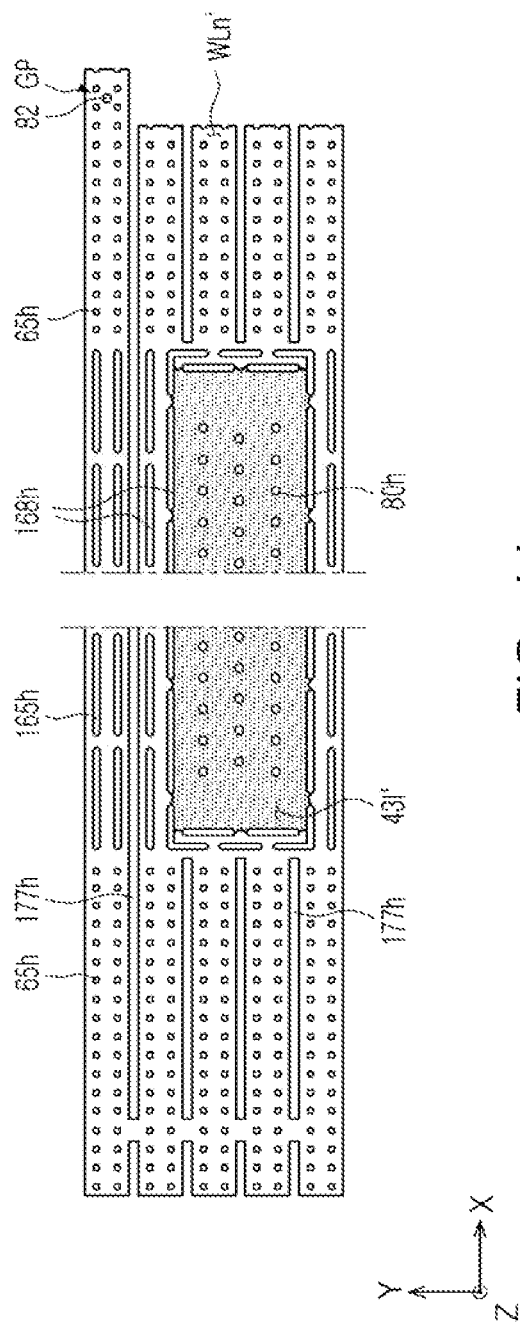

FIG. 11 is a plan diagram illustrating one of the gate horizontal layers 43M among the gate horizontal layers 39G and 43M (which may be word lines), and one of the insulating horizontal layers 43I' in contact with and connected to the gate horizontal layer 43M. The gate horizontal layer 43M may be an n-th word line layer WLn'.

Referring to FIG. 11, the gate horizontal layer WLn' may be connected to the insulating horizontal layers 43I' and may surround a side surface of the insulating horizontal layer 43I'.

In an example embodiment, the gate horizontal layer WLn may be formed of a conductive material. In this case, the gate horizontal layer WLn, which may be a word line, may be in contact with the insulating horizontal layer 43I'.

In an example embodiment, the gate horizontal layer WLn may include the first gate layer 45 (which may be a dielectric material layer) and a second gate layer 47 (which may be a conductive material layer, as described in FIG. 5A). In this case, the second gate layer 47 may be defined as a word line, and the first gate layer 45 may be interposed between the word line and the one of the insulating horizontal layers 43I'.

The barrier structure 68, the supporter pattern 65, the additional supporter pattern 165, and the separation structures 177 described in FIG. 3 may be openings 68h, 65h, 165h, and 177h penetrating the gate horizontal layer WLn'.

The gate horizontal layer WLn' may have the gate pad region GP on an end in the first direction X. The gate pad region GP may be electrically connected to the gate contact plug 82.

Thus, one of the gate horizontal layers, i.e., one of the word lines WLn, may overlap the three gate horizontal layers, i.e., the three ground select gate electrodes GSL_1a, GSL_1b, and GSL_1c.

A modified example of the barrier structure 68 described in FIG. 5B will now be described with reference to FIG. 12.

Figure 12:
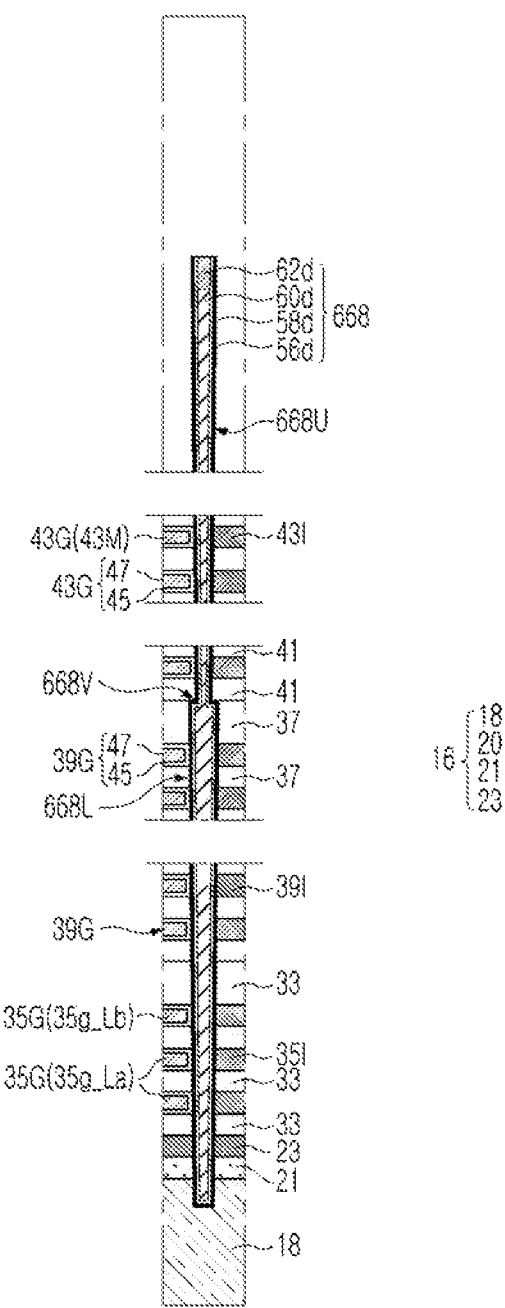
FIG. 12 is an enlarged cross-sectional diagram of a modified example of a semiconductor device according to an example embodiment.

FIG. 12 is an enlarged cross-sectional diagram of a modified example of the barrier structure 68 illustrated in the enlarged cross-sectional diagram in FIG. 5B.

Referring to FIG. 12, a shape of a cross-sectional surface of the barrier structure 68 in FIG. 5B may be modified to a shape of a cross-sectional surface similar to that of the vertical memory structure 54. Thus, the modified barrier structure 668 may include the same material as that of the vertical memory structure 54. For example, the barrier structure 668 may include a dummy insulating core pattern 60d, a dummy channel layer 58d covering side surfaces and bottom surfaces of the dummy insulating core pattern 60d, a dummy data storage structure 56d disposed on an external side surface and a bottom surface of the dummy channel layer 58d, and a dummy pad pattern 62d in contact with the dummy channel layer 58d on the dummy insulating core pattern 60d. A side surface of the barrier structure 668 may have an inflection portion 668V corresponding to the inflection portion 54V (in FIG. 5A) of the side surface of the vertical memory structure 54 (in FIG. 5A). The barrier structure 668 may include a lower vertical portion 668L, an upper vertical portion 668U on the lower vertical portion 668L, and an inflection portion 668V disposed between the lower vertical portion 668L and the upper vertical portion 668U.

Below, a modified example of the supporter pattern 65 described with reference to FIG. 5C will now be described with reference to FIG. 13.

Figure 13:
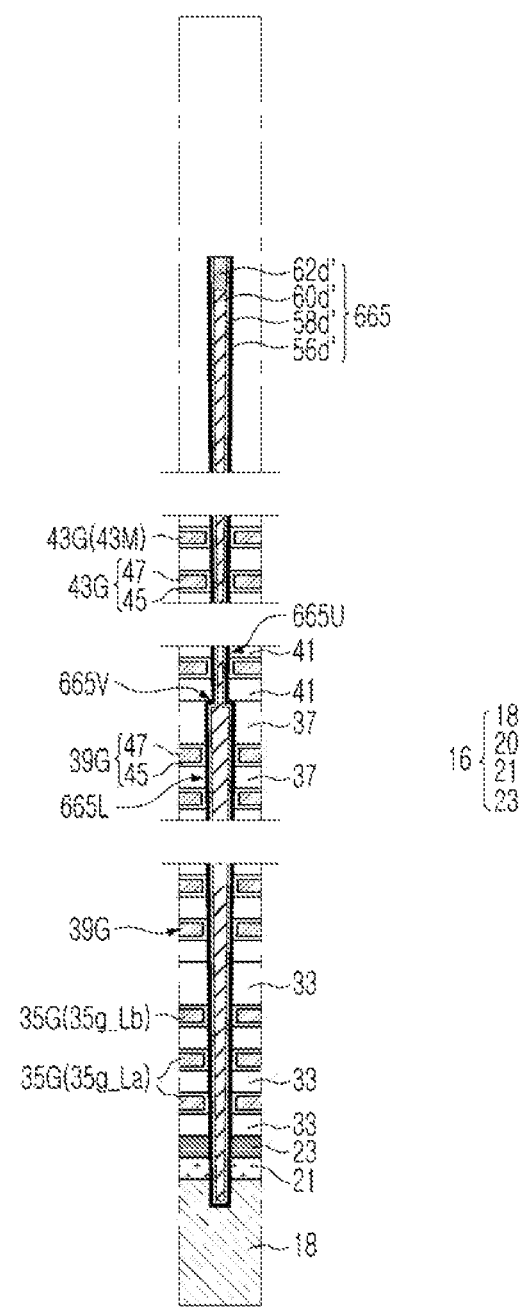
FIG. 13 is an enlarged cross-sectional diagram of a modified example of a semiconductor device according to an example embodiment.

FIG. 13 is an enlarged cross-sectional diagram of a modified example of the supporter pattern 65 illustrated in FIG. 5C.

Referring to FIG. 13, a shape of a cross-sectional surface of the supporter pattern 65 in FIG. 5C may be modified to a shape of a cross-sectional surface similar to that of the vertical memory structure 54. Thus, the modified supporter pattern 665 may include the same material as that of the vertical memory structure 54. For example, the supporter pattern 665 may include a dummy insulating core pattern 60d', a dummy channel layer 58d' covering side and bottom surfaces of the dummy insulating core pattern 60d', a dummy data storage structure 56d' disposed on an external side surface and a bottom surface of the dummy channel layer 58d', and a dummy pad pattern 62d' in contact with the dummy channel layer 58d' on the dummy insulating core pattern 60d'. A side surface of the supporter pattern 665 may have an inflection portion 665V corresponding to the inflection portion 54V (in FIG. 5A) of the side surface of the vertical memory structure 54 (in FIG. 5A). The supporter pattern 665 may include a lower vertical portion 665L, an upper vertical portion 665U on the lower vertical portion 665L, and the inflection portion 665V disposed between the lower vertical portion 665L and the upper vertical portion 665U.

Below, an example embodiment of a semiconductor device will now be described with reference to FIGS. 14A and 14B.

Figure 14A:
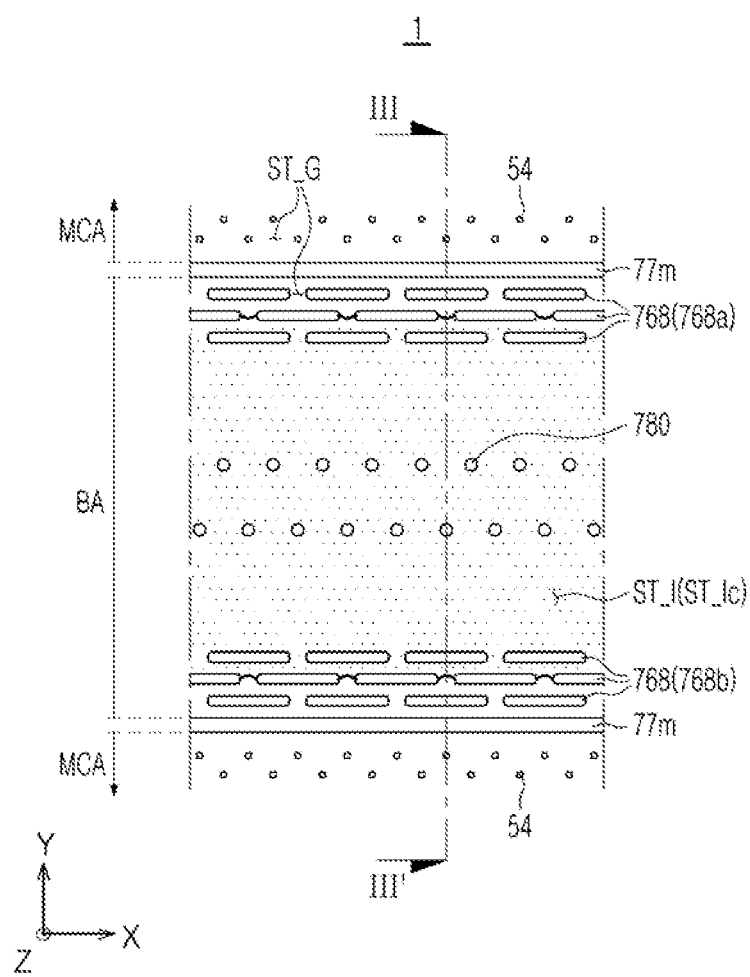
FIG. 14A is an enlarged plan diagram of a modified example of a semiconductor device according to an example embodiment.

FIG. 14A is a plan diagram of a semiconductor device according to an example embodiment. FIG. 14B is a cross-sectional diagram taken along line III-III' in FIG. 14A.

Figure 14B:
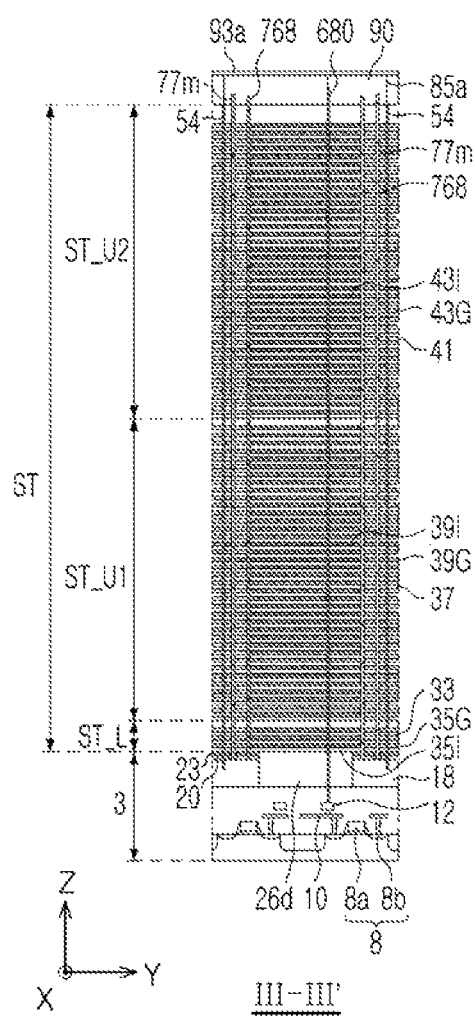
FIG. 14B is a cross-sectional diagram taken along line IV-IV' in FIG. 14A.

Referring to FIGS. 14A and 14B, the semiconductor device 1 according to an example embodiment may further include a through region BA disposed in the second direction Y in the memory cell region MCA. The through region BA may be disposed between adjacent memory cell regions MCA.

The through region BA may be defined by main separation structures 77m. At least one of the main separation structures 77m may extend from at least one of the first and second main separation structures 77m1 and 77m2 illustrated in FIG. 1.

The same stack structure ST as described above may be disposed in the through region BA. In the through region BA, the gate stack region ST_G of the stack structure ST may be disposed in a region adjacent to the main separation structures 77m, and the insulating stack region ST_I of the stack structure ST may be disposed in a central region of the through region BA. In the stack structure ST, a level of an upper surface in the memory cell region MCA and a level of an upper surface in the through region BA may be the same.

In the through region BA, a barrier structure 768 may penetrate the stack structure ST adjacent to the main separation structures 77m.

The barrier structure 768 may include a first barrier structure 768a and a second barrier structure 768b parallel to each other and spaced apart from each other in the second direction Y. Each of the first and second barrier structures 768a and 768b may be the same as one of the first barrier structures of various shapes as described with reference to FIGS. 2 and 8A to 8E. For example, each of the first and second barrier structures 768a and 768b may include the same barrier patterns as those of the first barrier structure 68a illustrated in FIG. 3.

In the through region BA, a peripheral through contact plug 680 may penetrate the insulating stack region ST_I of the stack structure ST, extending downwardly, and penetrate the gap-fill insulating layer 26d penetrating the pattern structure 16, to be in contact with the peripheral pad 11 of the peripheral circuit 7. The insulating stack region ST_I of the stack structure ST in the through region BA may be defined as a third insulating stack region ST_Ic.

In the through region BA, a boundary surface between the gate stack region ST_G and the insulating stack region ST_I may be in contact with the barrier structure 768.

As described above, the bit line 93a may be disposed on the vertical memory structures 54 disposed in the memory cell region MCA. The bit line 93a may have a linear shape extending in the second direction Y. The bit line 93a may cross an upper portion of the through region BA.

The bit line 93a may be electrically connected to the peripheral through contact plug 680. Thus, the vertical memory structures 54 may be electrically connected to the peripheral circuit 7 through the bit line 93a and the peripheral through contact plug 680.

Below, a modified example of a semiconductor device will now be described with reference to FIG. 15.

Figure 15:
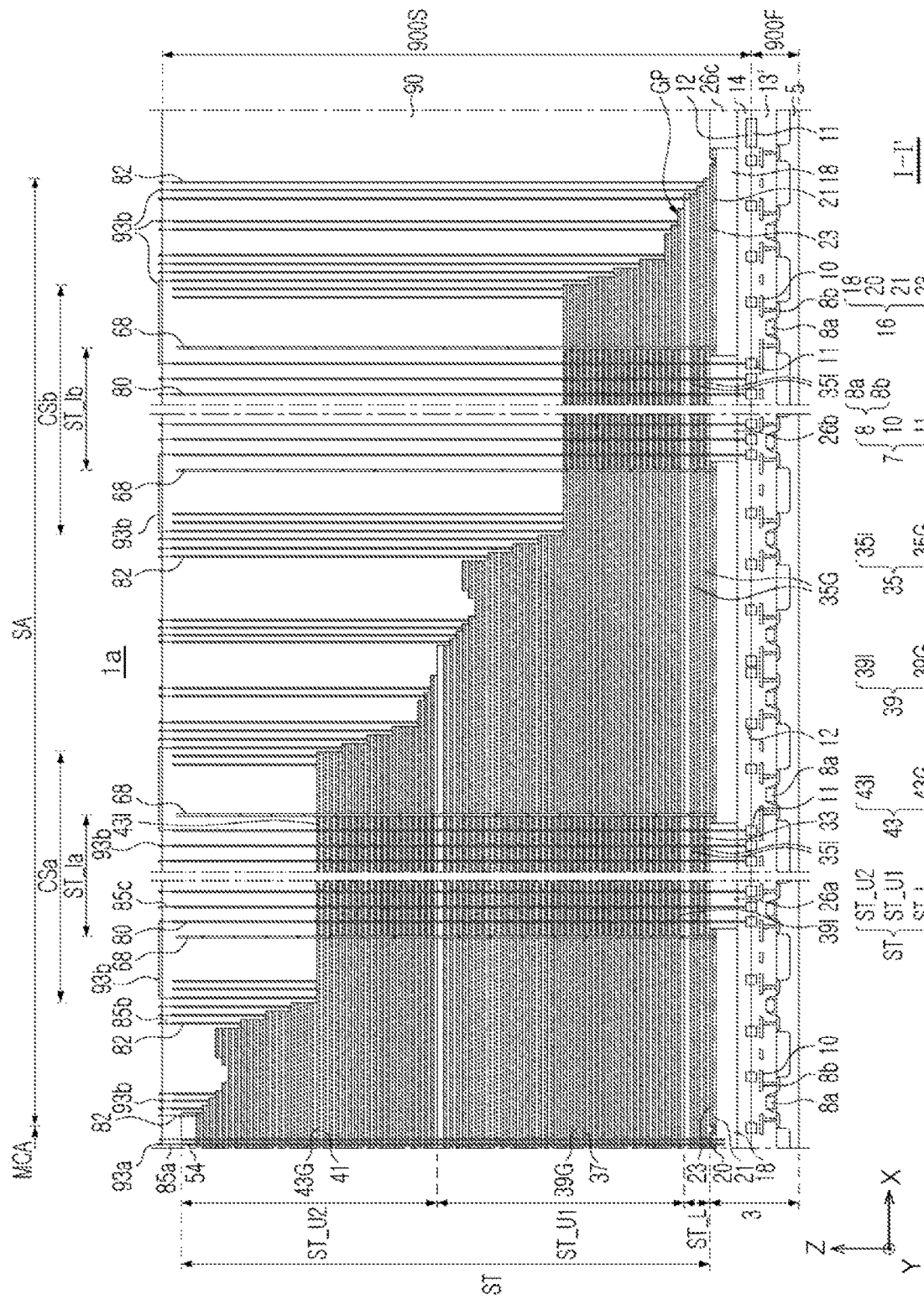
FIG. 15 is a cross-sectional diagram of a modified example of a semiconductor device according to an example embodiment.

FIG. 15 is a cross-sectional diagram taken along line III-III' in FIG. 1.

In a modified example, referring to FIG. 15, a semiconductor device 1a may include a first structure 900F and a second structure 900S. The first structure 900F may include the semiconductor substrate 5 and the peripheral circuit 7 described with reference to FIGS. 1 to 4B. The peripheral circuit 7 may include the peripheral transistor 8, the peripheral wiring 10, and the peripheral pads 11 described with reference to FIGS. 1 to 4B. The first structure 900F may cover the peripheral circuit 7 on the semiconductor substrate 5 and may include a lower insulating layer 13' having an upper surface coplanar with the upper surfaces of the peripheral pads 11.

The second structure 900S may include the pattern structure 16, the stack structure ST, the capping insulating structure 90, the vertical memory structures 54, the supporter patterns 65, the barrier structure 68, the gate contact plugs 82, the peripheral through contact plugs 80, the bit lines 93a, and the gate connection wirings 93b described with reference to FIGS. 1 to 4B.

The second structure 900S may further include an intermediate insulating layer 14 disposed between the pattern structure 16 and the first structure 900F, and bonding pads 12 in contact with and bonded to the peripheral pads 11 of the first structure 900F. In an example embodiment, the peripheral pads 11 and the bonding pads 12 may be formed of a copper material. The intermediate insulating layer 14 may cover the peripheral pads 11, and may be in contact with the lower insulating layer 13' of the first structure 900F.

The first structure 900F may be a single semiconductor chip, and the second structure 900S may be a single semiconductor chip. By a wafer bonding process, the peripheral pads 11 of the first structure 900F, which is a semiconductor chip, may be in contact with and bonded to the bonding pads 12 of the second structure 900S, which is a semiconductor chip. Thus, the semiconductor device 1a may include the first and second structures 900F and 900S bonded to each other, i.e., two semiconductor chips bonded to each other.

In an example embodiment, the peripheral circuit 7 of the first structure 900F may be disposed in a lower portion of the stack structure ST of the second structure 900S, but an example embodiment thereof is not limited thereto. For example, in the example embodiment, with reference to the stack structure ST of the second structure 900S, a peripheral circuit corresponding to the peripheral circuit 7 may be disposed in an upper portion of the stack structure ST of the second structure 900S. In this case, a peripheral circuit corresponding to the peripheral circuit 7 and a semiconductor substrate corresponding to the semiconductor substrate 5 may be disposed in order on the stack structure ST of the second structure 900S.

FIGS. 16 to 18B are cross-sectional diagrams of a method of manufacturing a semiconductor device according to an example embodiment.

Figure 16:
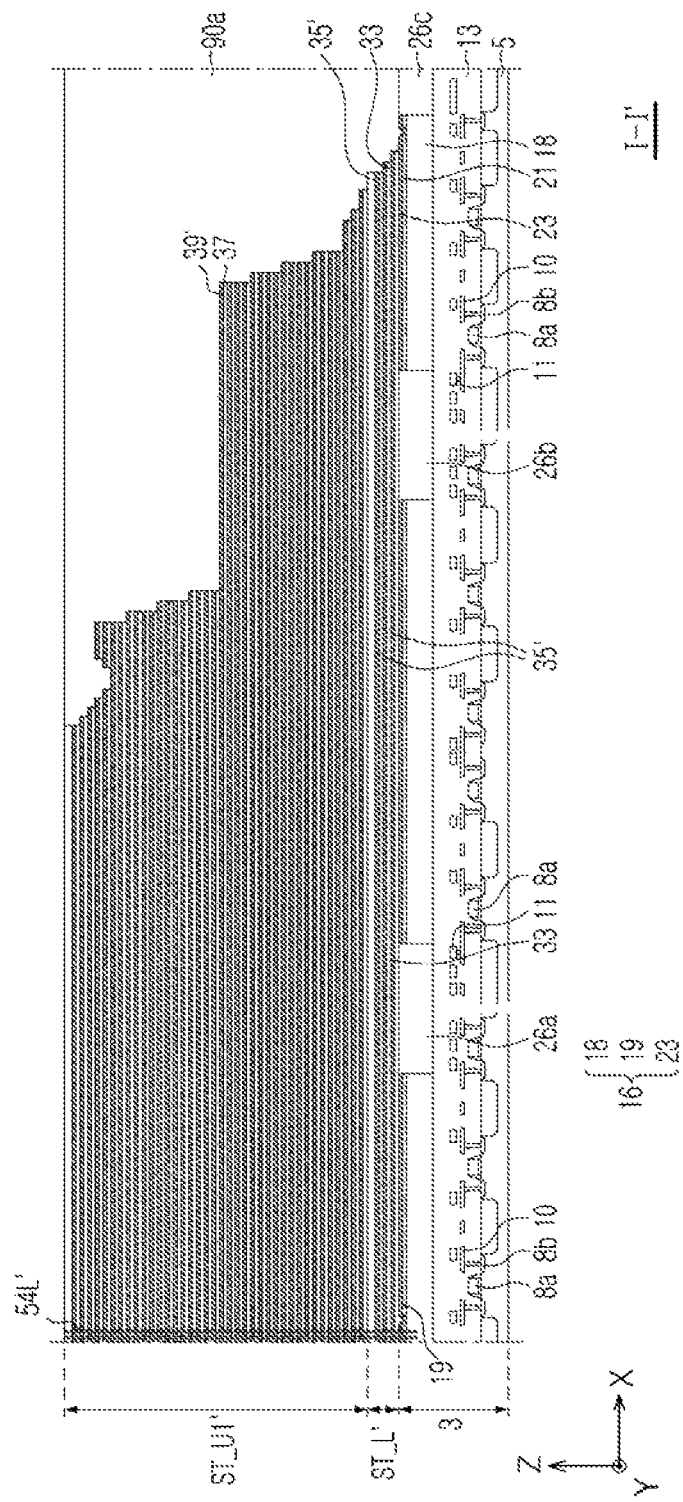
FIGS. 16 to 18B are cross-sectional diagrams of a method of manufacturing a semiconductor device according to an example embodiment.

Referring to FIG. 16, a lower structure 3 may be formed. The lower structure 3 may include a semiconductor substrate 5, a peripheral circuit 7 on the semiconductor substrate 5, a lower insulating layer 13 covering the peripheral circuit 7 on the semiconductor substrate 5, a pattern structure 16 on the lower insulating layer 13, first and second gap-fill insulating layers 26a and 26b penetrating the pattern structure 16, and an outer insulating layer 26c covering an external side surface of the pattern structure 16. The pattern structure 16 may include a lower pattern layer 18, an intermediate pattern layer 19 on the lower pattern layer 18, and an upper pattern layer 23 on the intermediate pattern layer 19. The intermediate pattern layer 19 may include a silicon oxide layer, a silicon nitride layer, and a silicon oxide layer stacked in order. The lower and upper pattern layers 18 and 23 may be polysilicon layers.

A preliminary lower stack structure ST_L' may be formed on the lower structure 3. The preliminary lower stack structure ST_L' may include lower interlayer insulating layers 33 and preliminary lower horizontal layers 35' alternately stacked. A capping insulating layer may be formed to cover the preliminary lower stack structure ST_U1'.

A first preliminary upper stack structure ST_U1' may be formed on the preliminary lower stack structure ST_L'. The first preliminary upper stack structure ST_U1' may include first upper interlayer insulating layers 37 and first preliminary upper horizontal layers 39' alternately stacked. The preliminary lower horizontal layers 35' and the first preliminary upper horizontal layers 39' may be formed of silicon nitride. A capping insulating layer 90a may be formed to cover the first preliminary lower stack structure ST_U1'.

Lower vertical structures 54L' may be formed to penetrate the preliminary lower stack structure ST_L' and the first preliminary upper stack structure ST_U1'.

Figure 17:
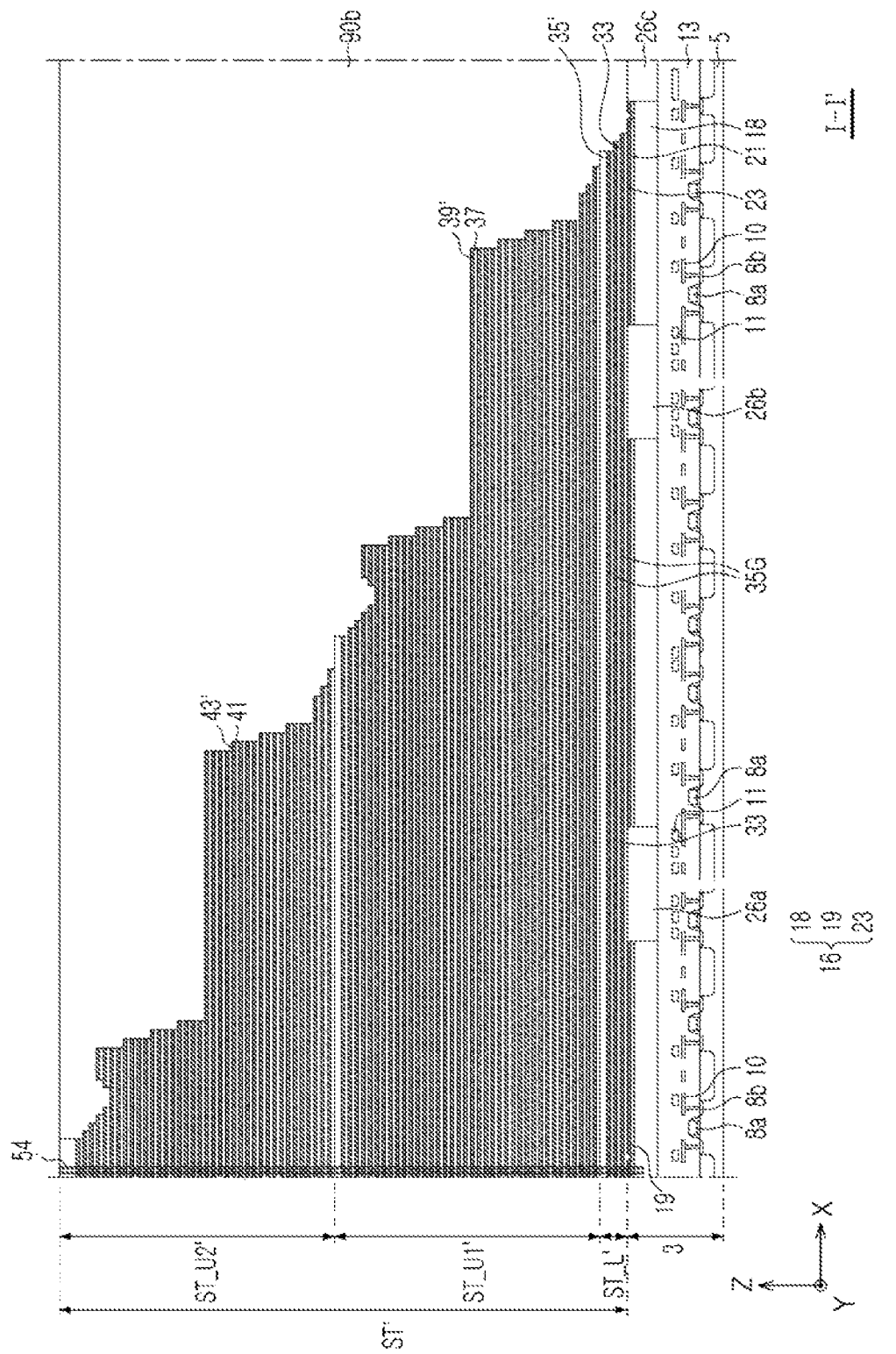

Referring to FIG. 17, a second preliminary upper stack structure ST_U2' may be formed on the first preliminary upper stack structure ST_U1'. The second preliminary upper stack structure ST_U2' may include second upper interlayer insulating layers 41 and second preliminary upper horizontal layers 43' alternately stacked. The second preliminary upper horizontal layers 43' may be formed of silicon nitride. A capping insulating layer 90b may be formed to cover the second preliminary lower stack structure ST_U2'. Since the capping insulating layer 90b may be formed of the same material as that of the capping insulating layer 90a illustrated in FIG. 16, a boundary between the capping insulating layer 90b and the capping insulating layer 90a formed in FIG. 16 may not be indistinct or there may be no boundary therebetween. Below, since a boundary between the elements referred to as "capping insulating layers" may be indistinct, the elements may not be distinguished from each other by a boundary surface, and will now be described as a single layer.

The preliminary lower stack structure ST_L', the first preliminary upper stack structure ST_U1', and the second preliminary upper stack structure ST_U2' may form a preliminary stack structure ST'. Preliminary channel holes may be formed to penetrate the second preliminary upper stack structure ST_U2' and exposing the lower vertical structures 54L', and the lower vertical structures 54L' may be removed, thereby forming channel holes penetrating the preliminary stack structure ST'. Vertical memory structures 54 may be formed in the channel holes.

Figure 18A:
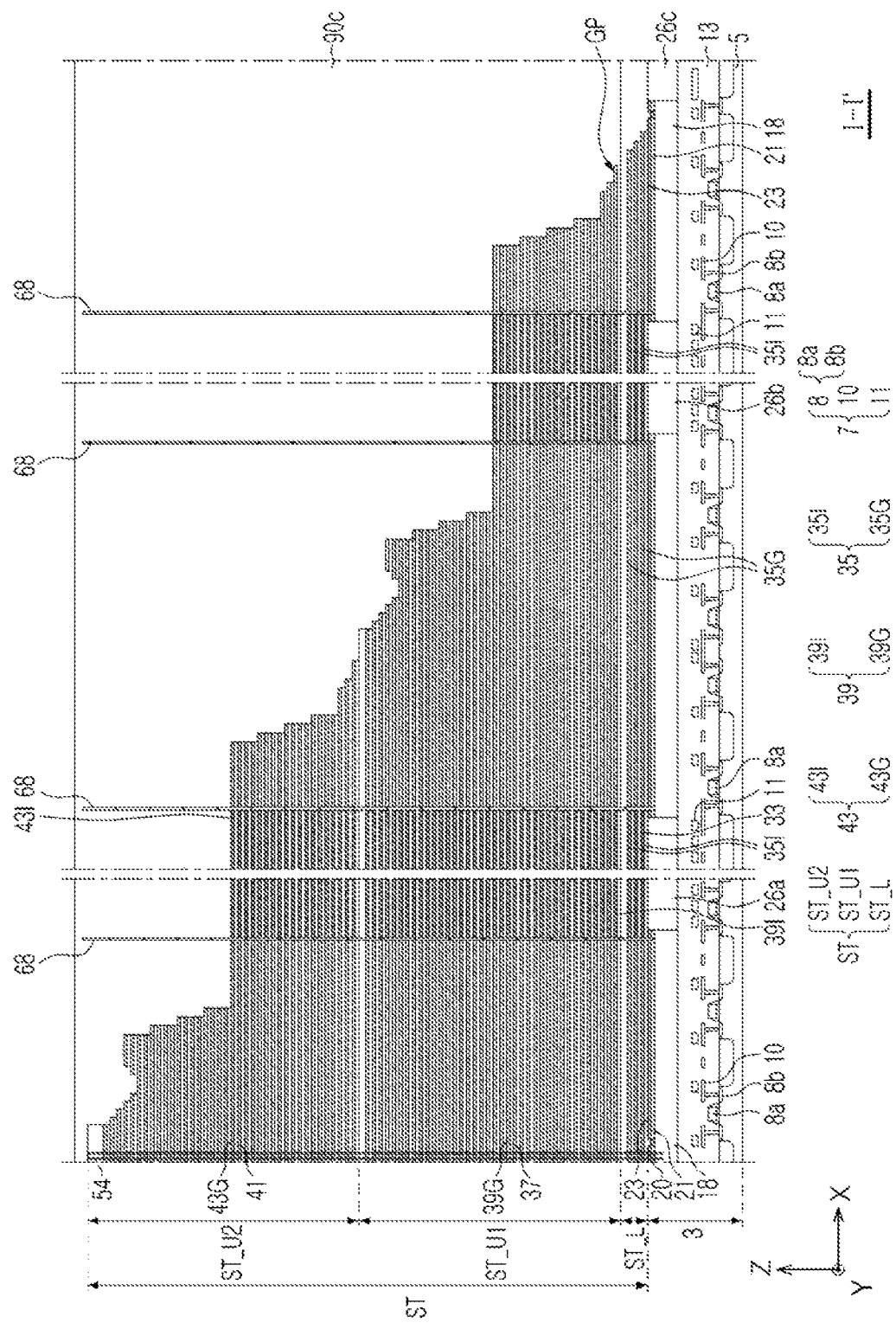
Figure 18B:
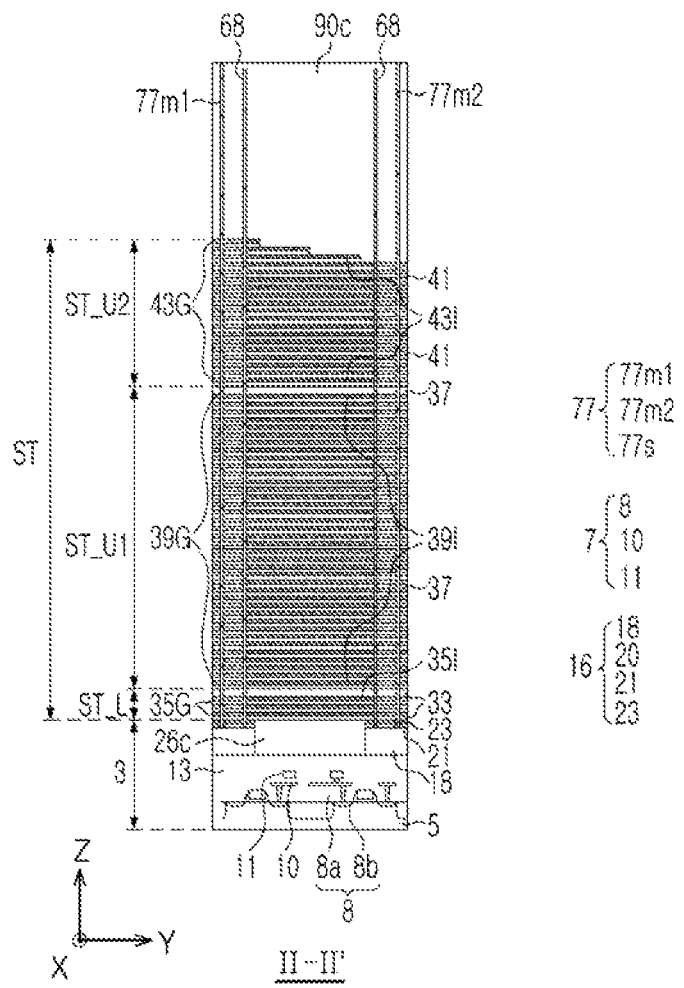

Referring to FIGS. 18A and 18B, a barrier structure 68 and a supporter pattern 65 (in FIGS. 2 and 3) may be formed to penetrate the preliminary stack structure ST'. In an example embodiment, the barrier structure 68 and the supporter pattern 65 (in FIGS. 2 and 3) may be formed simultaneously. For example, the barrier structure 68 and the supporter pattern 65 (in FIGS. 2 and 3) may be formed of silicon oxide. A capping insulating layer 90c may be formed, and separation trenches for forming the separation structures 77 may be formed. The separation trenches may penetrate the preliminary stack structure ST' and may extend into the pattern structure 16. An intermediate pattern layer of the memory cell region MCA exposed by the separation trenches may be replaced with a first intermediate pattern layer 20. The first intermediate pattern layer 20 may be formed of a polysilicon layer, and the remaining intermediate pattern layer may be referred to as a second intermediate pattern layer 21.

Empty spaces may be formed by partially etching the preliminary lower horizontal layers 35', the first preliminary upper horizontal layers 39', and the second preliminary upper horizontal layers 43', exposed by the separation trenches by performing an etching process. Gate horizontal layers may be formed to fill the empty spaces. The gate horizontal layers 35G, 39G, and 43G may be the same as the examples illustrated in FIG. 5A. Among the preliminary lower horizontal layers 35', the first preliminary upper horizontal layers 39', and the second preliminary upper horizontal layers 43', the remaining horizontal layers may be referred to as insulating horizontal layers 35I, 39I, and 43I. Thus, horizontal layers may be formed to include the gate horizontal layers 35G, 39G, and 43G and the insulating horizontal layers 35I, 39I, and 43I. Thus, a stack structure ST including the horizontal layers may be formed. Thereafter, separation structures 77m1 and 77m2 may be formed to fill the separation trenches.

Referring again to FIGS. 4A and 4B, an additional capping insulating layer may be formed, and through contact plugs 80 and gate contact plugs 82 may be formed. Thereafter, the capping insulating structure 90 may be formed by forming an additional capping insulating layer. Thereafter, bit line connection patterns 85a, 85b, and 85c may be formed, and bit lines 93a and gate connection wirings 93b may be formed.

In an example embodiment of forming the barrier structure 68, as described in FIG. 17, in the etching process for forming the empty spaces by partially etching the preliminary lower horizontal layers 35', the first preliminary upper horizontal layers 39', and the second preliminary upper horizontal layers 43' (which are exposed by the separation trenches), a path through which an etching gas or an etching solution moves (for etching the preliminary lower horizontal layers 35', the first preliminary upper horizontal layers 39', and the second preliminary upper horizontal layers 43') may be lengthened. Thus, the preliminary lower horizontal layers 35', the first preliminary upper horizontal layers 39', and the second preliminary upper horizontal layers 43' (which are disposed in a region surrounded by the barrier structure 68) may be prevented from being etched. Thus, a planar area of the insulating stack region ST_I defined between the first and second main separation structures 77m1 and 77m2 (in FIGS. 2 and 3) may be sufficiently secured. Thus, due to the barrier structure 68, a space in which the through contact plugs 80 are disposed may be sufficiently secured without increasing an entire area. Thus, integration density of the semiconductor device 1 may be improved.

In an example embodiment, the supporter pattern 65 may prevent the interlayer insulating layers 33, 37, and 41 from being bent or deformed in the etching process that forms the empty spaces by partially etching the preliminary lower horizontal layers 35', the first preliminary upper horizontal layers 39', and the second preliminary upper horizontal layers 43', exposed by the separation trenches. Thus, since the supporter pattern 65 may prevent the thickness of a portion of the gate horizontal layers 35G, 39G, and 43G from being decreased or short-circuited, reliability of the semiconductor device 1 may be improved.

Figure 19:
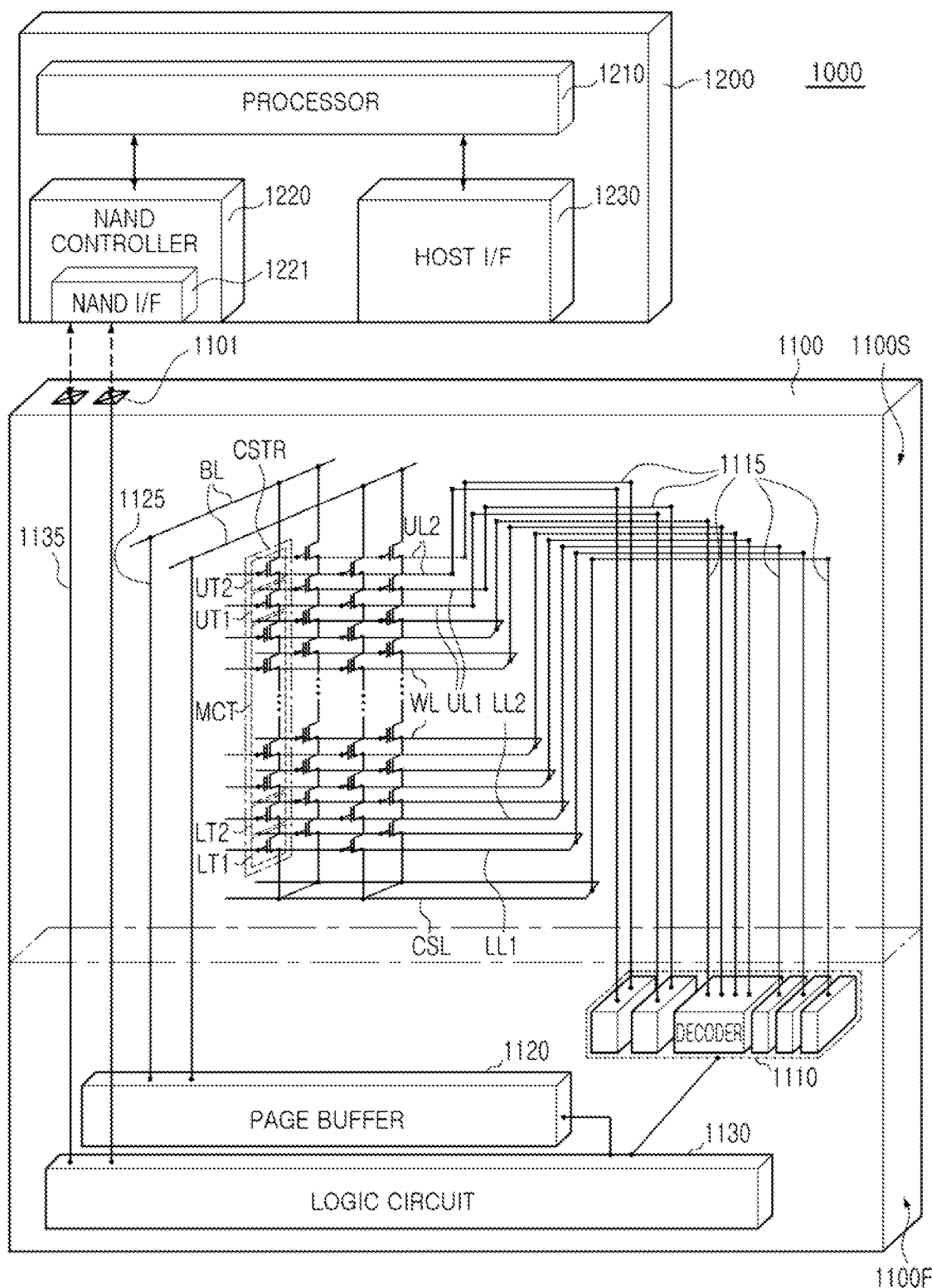
FIG. 19 is a diagram of a data storage system including a semiconductor device according to an example embodiment.

FIG. 19 is a diagram of a data storage system including a semiconductor device according to an example embodiment.

Referring to FIG. 19, a data storage system 1000 according to an example embodiment may include a semiconductor device 1100 and a controller 1200 electrically connected to the semiconductor device 1100. The data storage system 1000 may be implemented as a storage device including the semiconductor device 1100, or an electronic device including a storage device. For example, the data storage system 1000 may be implemented by a solid state drive device (SSD), a universal serial bus (USB), a computing system, a medical device, or a communication device, which may include the semiconductor device 1100.

In an example embodiment, the data storage system 1000 may be configured as an electronic system for storing data.

The semiconductor device 1100 may be implemented by a semiconductor device described in one of the aforementioned example embodiments with reference to FIGS. 1 to 15. The semiconductor device 1100 may include a first structure 1100F and a second structure 1100S on the first structure 1100F.

In example embodiments, the first structure 1100F may be disposed adjacent to the second structure 1100S.

In example embodiments, the semiconductor device 1100 may include two semiconductor chips bonded to each other. For example, in the semiconductor device 1100, the first structure 1100F may be configured as a single semiconductor chip, and the second structure 1100S may be configured as a single semiconductor chip bonded to the first structure 1100F by a wafer bonding process. For example, pads of the first structure 1100F, formed of a copper material, and pads of the second structure 1100S, formed of a copper material, may be in contact with and bonded to each other. Thus, the semiconductor device 1100 may include the first and second structures 1100F and 1100S bonded to each other, i.e., two semiconductor chips bonded to each other.

The first structure 1100F may be configured as a peripheral circuit structure including the decoder circuit 1110, the page buffer 1120, and the logic circuit 1130. For example, the first structure 1100F may include the peripheral circuit 7 (in FIGS. 4A or 15) described above.

The second structure 1100S may be configured as a memory cell structure including a bit line BL, a common source line CSL, word lines WL, first and second gate upper lines UL1 and UL2, first and second gate lower lines LL1 and LL2, and memory cell strings CSTR disposed between the bit line BL and the common source line CSL.

The pattern structure 16 (in FIG. 4A) described above may include silicon layers 18, 20, and 23 having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of lower the transistors LT1 and LT2, respectively. The word lines WL may be gate electrodes of memory cell transistors MCT. The gate upper lines UL1 and UL2 may be gate electrodes of upper transistors UT1 and UT2, respectively.

The gate horizontal layers 35G, 39G, and 43G described above may form the gate lower lines LL1 and LL2, the word lines WL, and the gate upper lines UL1 and UL2. For example, the first and second lower gate horizontal layers 35g_La and 35Lb as in FIG. 5A may form the gate lower lines LL1 and LL2, the gate horizontal layers 39G and 43M may form the word lines WL, and the first and second upper gate horizontal layers 43g_Ua and 43g_Ub may form the gate upper lines UL1 and UL2.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation for deleting data stored in the memory cell transistors MCT using a gate induced leakage current (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F to the second structure 1100S.

The first connection wirings 1115 may include the gate contact plugs 82, the gate connection wirings 93b, and the through contact plugs 80 described above.

The bit lines BL may be electrically connected to the page buffer 1120 through second connection wirings 1125 extending from the first structure 1100F to the second structure 1100S. The bit lines BL may be the bit lines 93a (FIGS. 4A, 4B, and 15) described above.

In the first structure 1100F, the decoder circuit 1110 and the page buffer 1120 may perform a control operation on at least one select memory cell transistor MCT. The decoder circuit 1110 and the page buffer 1120 may be controlled by a logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the data storage system 1000 may include multiple semiconductor devices 1100, and in this case, the controller 1200 may control the multiple semiconductor devices 1100.

The processor 1210 may control an overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command is received from an external host through the host interface 1230, the processor 1210 may control the semiconductor device 1100 in response to the control command.

Figure 20:
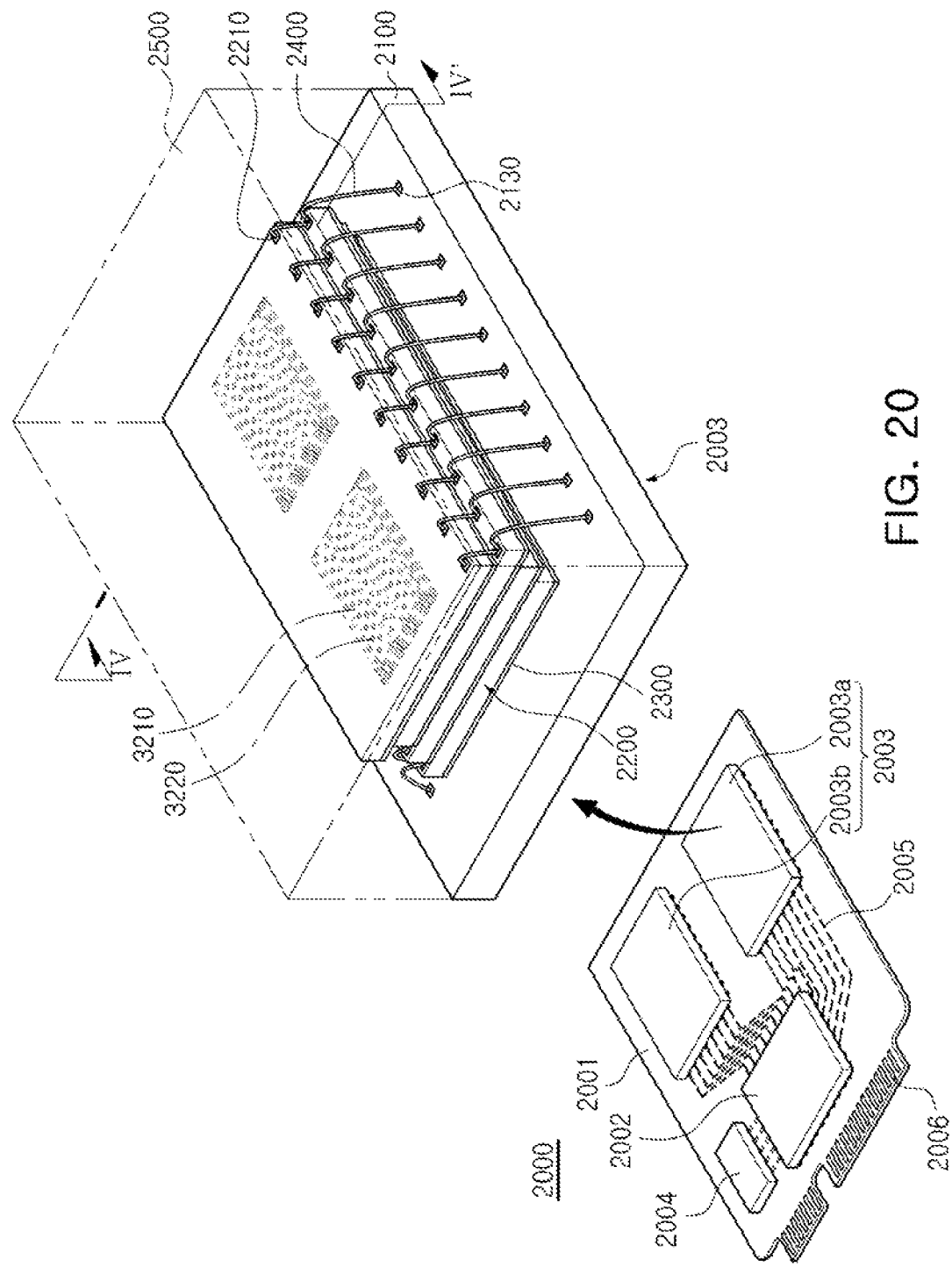
FIG. 20 is a perspective diagram of a data storage system including a semiconductor device according to an example embodiment.

FIG. 20 is a perspective diagram of a data storage system including a semiconductor device according to an example embodiment.

Referring to FIG. 20, a data storage system 2000 according to an example embodiment may include a main substrate 2001, a controller 2002 mounted on the main substrate 2001, one or more semiconductor packages 2003, and a dynamic random access memory (DRAM) 2004. The semiconductor package 2003 and the DRAM 2004 may be connected to the controller 2002 by wiring patterns 2005 formed on the main substrate 2001.

The main substrate 2001 may include a connector 2006 including pins for coupling to an external host. The number and arrangement of the pins in the connector 2006 may be varied according to a communication interface between the data storage system 2000 and the external host. In example embodiments, the data storage system 2000 may communicate with the external host by one of interfaces such as universal serial bus (USB), peripheral component interconnect express (PCI-Express), serial advanced technology attachment (SATA), and M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speed between the semiconductor package 2003, a data storage space, and an external host. The DRAM 2004 included in the data storage system 2000 may also operate as a cache memory, and may provide a space for temporarily storing data in a control operation on the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including multiple semiconductor chips 2200. Each of the semiconductor chips 2200 may include a semiconductor device described in one of the aforementioned example embodiments with reference to FIGS. 1 to 15.

Each of the first and second semiconductor packages 2003a and 2003b may include the package substrate 2100, the semiconductor chips 2200 on the package substrate 2100, adhesive layers 2300 disposed on lower surfaces of each of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each of the semiconductor chips 2200 may include an input/output pad 2210.

In example embodiments, the connection structure 2400 may be configured as a bonding wire electrically connecting the input/output pad 2210 to the package upper pads 2130. Thus, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other through a connection structure including a through silicon via (TSV), instead of the connection structure 2400 of the bonding wire method.

In example embodiments, the controller 2002 and the semiconductor chips 2200 may be included in a single package. For example, the controller 2002 and the semiconductor chips 2200 may be mounted on an interposer substrate different from the main substrate 2001, and the controller 2002 may be connected to the semiconductor chips 2200 by the wirings formed on the interposer substrate.

Figure 21:
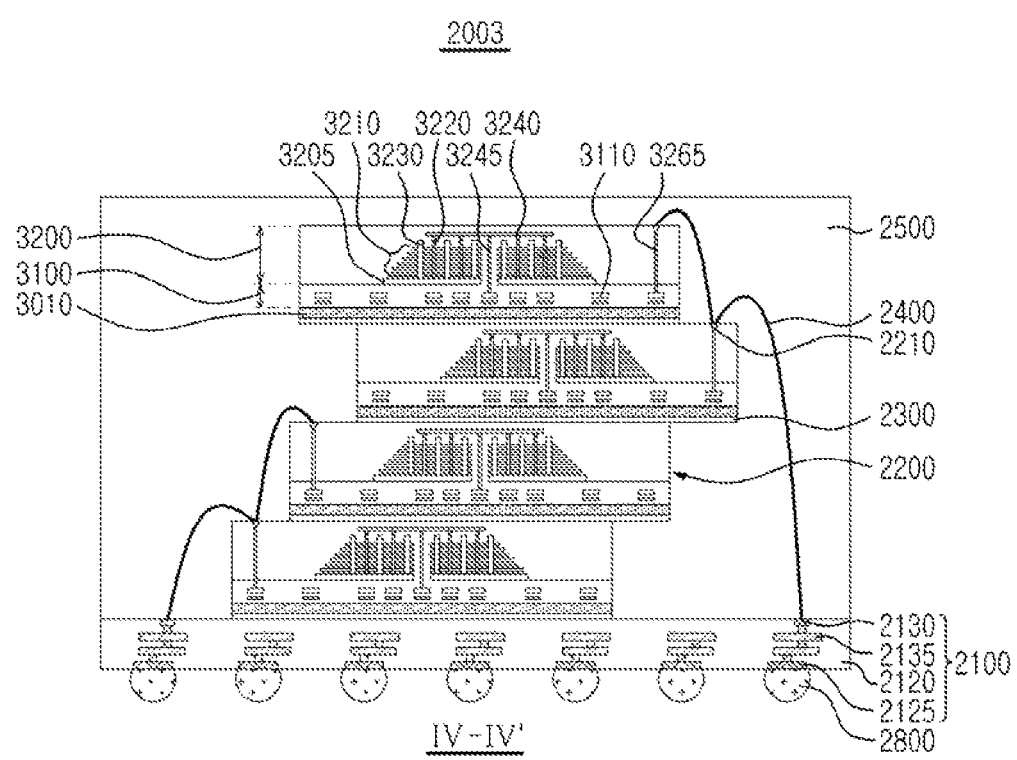
FIG. 21 is a cross-sectional diagram of a data storage system including a semiconductor device according to an example embodiment.

FIG. 21 is a cross-sectional diagram of a data storage system including a semiconductor device according to an example embodiment. FIG. 21 illustrates a cross-sectional diagram of the semiconductor package 2003 illustrated in FIG. 20 taken along line IV-IV'.

Referring to FIG. 21, in the semiconductor package 2003, the package substrate 2100 may be configured as a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wirings 2135 electrically connecting the package upper pads 2130 to the lower pads 2125 in the package substrate body portion 2120. The package upper pads 2130 may be electrically connected to connection structures 2400. The lower pads 2125 may be connected to the wiring patterns 2005 of the main substrate 2010 of the data storage system 2000 as in FIG. 20 through the conductive connection portions 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures 3230 penetrating the gate stack structure 3210, bit lines 3240 electrically connected to the memory channel structures 3220, and gate connection wirings 93b (in FIG. 4A) electrically connected to the word lines WL (in FIG. 19) of the gate stack structure 3210. The first structure 3100 may include the first structure 1100F illustrated in FIG. 19, and the second structure 3200 may include the second structure 1100S illustrated in FIG. 19. Thus, each of the semiconductor chips 2200 may include the semiconductor device 1 described in one of the aforementioned example embodiments with reference to FIGS. 1 to 15.

Each of the semiconductor chips 2200 may include a through wiring 3245 electrically connected to the peripheral wirings 3110 of the first structure 3100 and extending into the second structure 3200. The through wiring 3245 may penetrate the gate stack structure 3210, and may be further disposed on an external side of the gate stack structure 3210. The through wiring 3245 may be the through contact plug 680 described with reference to FIG. 15.

Each of the semiconductor chips 2200 may further include an input/output connection wiring 3265 electrically connected to peripheral wirings 3110 of the first structure 3100 and extending into the second structure 3200, and an input/output pad 2210 electrically connected to the input/output connection wiring 3265.

By way of summation and review, embodiments may provide a semiconductor device having improved integration density and reliability. Embodiments may provide a data storage system including a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Thus, it will be understood by those of skill in the art that various changes in form and details may be made without departing from the spirit and scope of the present invention as set forth in the following claims.

What is claimed is:
1. A semiconductor device, comprising:
a stack structure including interlayer insulating layers and horizontal layers alternately stacked in a vertical direction;
a first separation structure and a second separation structure penetrating through the stack structure in the vertical direction;
a first vertical pattern and a second vertical pattern penetrating through the stack structure and parallel to each other between the first and second separation structures;
a third vertical pattern and a fourth vertical pattern penetrating through the stack structure and parallel to each other between the first and second separation structures;
a fifth vertical pattern and a sixth vertical pattern between the first vertical pattern and the second vertical pattern;
a seventh vertical pattern between the first vertical pattern and the first separation structure;

an eighth vertical pattern between the second vertical pattern and the second separation structure; and
a plurality of contact plugs penetrating through the stack structure in the vertical direction and between the first separation structure and the second separation structure,
wherein each of the first and second separation structures extends in a first direction perpendicular to the vertical direction,
wherein each of the first and second vertical patterns extends in the first direction,
wherein each of the third and fourth vertical patterns extends in the first direction,
wherein a length of at least one of the first and second separation structures in the first direction is greater than a length of each of the first, second, third and fourth vertical patterns in the first direction,
wherein the length of each of the first, second, third and fourth vertical patterns in the first direction is greater than a width of each of the fifth and sixth vertical patterns in the first direction,
wherein the first vertical pattern is adjacent to the first separation structure, and the second vertical pattern is adjacent to the second separation structure,
wherein the third vertical pattern is adjacent to the first separation structure, and the fourth vertical pattern is adjacent to the second separation structure,
wherein the fifth and sixth vertical patterns are between the first vertical pattern and the second vertical pattern, and
wherein a first distance between the first vertical pattern and the second vertical pattern is different from a second distance between the third vertical pattern and the fourth vertical pattern.

2. The semiconductor device as claimed in claim 1, wherein the first distance between the first vertical pattern and the second vertical pattern is greater than the second distance between the third vertical pattern and the fourth vertical pattern.

3. The semiconductor device as claimed in claim 1, wherein the length of the first vertical pattern in the first direction is the same as the length of the second vertical pattern in the first direction.

4. The semiconductor device as claimed in claim 3, wherein the length of the third vertical pattern in the first direction is the same as the length of the fourth vertical pattern in the first direction.

5. The semiconductor device as claimed in claim 1, wherein the length of each of the third and fourth vertical patterns in the first direction is different from the length of each of the first and second vertical patterns in the first direction.

6. The semiconductor device as claimed in claim 1, wherein the length of each of the third and fourth vertical patterns in the first direction is greater than the length of each of the first and second vertical patterns in the first direction.

7. The semiconductor device as claimed in claim 1, wherein the stack structure includes a gate stack region and an insulating stack region,
wherein the horizontal layers of the gate stack region include a conductive material,
wherein the horizontal layers of the insulating stack region include an insulating material,
wherein at least one of the horizontal layers of the gate stack region include a single conductive layer,
wherein the third vertical pattern includes:
a first side surface facing the fourth vertical pattern;
a second side surface facing the first separation structure; and
a third side surface extending from the first and second side surfaces,
wherein the fourth vertical pattern includes:
a fourth side surface facing the third vertical pattern;
a fifth side surface facing the second separation structure; and
a sixth side surface extending from the fourth and fifth side surfaces,
wherein the single conductive layer includes:
a first portion adjacent to the third side surface of the third vertical pattern;
a second portion adjacent to the sixth side surface of the fourth vertical pattern;
a first extension portion extending in a second direction from the first portion, and
a second extension portion extending in a third direction from the second portion,
wherein the second direction is a direction from the first separation structure towards the second separation structure,
wherein the third direction is a direction from the second separation structure towards the first separation structure, and
wherein the plurality of contact plugs penetrate through the insulating stack region of the stack structure in the vertical direction.

8. The semiconductor device as claimed in claim 7, wherein the second distance between the third vertical pattern and the fourth vertical pattern is greater than a third distance between the first extension portion and the second extension portion.

9. The semiconductor device as claimed in claim 7, wherein a portion of the first extension portion and a portion of the second extension portion are between a portion of the third vertical pattern and a portion of the fourth vertical pattern.

10. The semiconductor device as claimed in claim 7, wherein the plurality of contact plugs include a first contact plug, and
wherein at least a portion of the first contact plug is between the first extension portion and the second extension portion.

11. The semiconductor device as claimed in claim 1, wherein at least one of the plurality of contact plugs is disposed at a center between the first separation structure and the second separation structure.

12. The semiconductor device as claimed in claim 1, wherein at least one of the plurality of contact plugs is disposed at a center between the third vertical pattern and the fourth vertical pattern.

13. The semiconductor device as claimed in claim 1, wherein the stack structure includes a gate stack region and an insulating stack region,
wherein the horizontal layers of the gate stack region include a conductive material, and
wherein the horizontal layers of the insulating stack region include an insulating material.

14. The semiconductor device as claimed in claim 13, wherein the insulating stack region includes:
a first insulating stack region between the third vertical pattern and the fourth vertical pattern; and
a second insulating stack region extending between the first vertical pattern and the second vertical pattern from the first insulating stack region, and wherein the gate stack region includes:
  first gate stack regions adjacent to the first and second separation structures; and
  a second gate stack region extending between the first vertical pattern and the second vertical pattern from the first gate stack regions.

15. The semiconductor device as claimed in claim 14,
wherein a portion of the second gate stack region is between the fifth vertical pattern and the sixth vertical pattern.

16. The semiconductor device as claimed in claim 13, further comprising:
  a vertical memory structure penetrating through the gate stack region of the stack structure in the vertical direction.

17. The semiconductor device as claimed in claim 1,
wherein the plurality of contact plugs are between the third vertical pattern and the fourth vertical pattern, and not between the first vertical pattern and the second vertical pattern.

18. A semiconductor device, comprising:
a stack structure including interlayer insulating layers and horizontal layers alternately stacked in a vertical direction;
a first separation structure and a second separation structure penetrating through the stack structure in the vertical direction;
a first vertical pattern and a second vertical pattern penetrating through the stack structure and parallel to each other between the first and second separation structures;
a third vertical pattern and a fourth vertical pattern penetrating through the stack structure and parallel to each other between the first and second separation structures;
a fifth vertical pattern and a sixth vertical pattern between the first vertical pattern and the second vertical pattern;
a seventh vertical pattern between the first vertical pattern and the first separation structure;
an eighth vertical pattern between the second vertical pattern and the second separation structure; and
a plurality of contact plugs penetrating through the stack structure in the vertical direction and between the first separation structure and the second separation structure,
wherein each of the first and second separation structures extends in a first direction perpendicular to the vertical direction,
wherein each of the first and second vertical patterns extends in the first direction,
wherein each of the third and fourth vertical patterns extends in the first direction,
wherein a length of at least one of the first and second separation structures in the first direction is greater than a length of each of the first, second, third and fourth vertical patterns in the first direction,
wherein the length of each of the first, second, third and fourth vertical patterns in the first direction is greater than a width of the fifth and sixth vertical patterns in the first direction,
wherein the first vertical pattern is adjacent to the first separation structure, and the second vertical pattern is adjacent to the second separation structure,
wherein the third vertical pattern is adjacent to the first separation structure, and the fourth vertical pattern is adjacent to the second separation structure,
wherein a first distance between the first vertical pattern and the second vertical pattern is greater than a second distance between the third vertical pattern and the fourth vertical pattern,
wherein the length of each of the third and fourth vertical patterns in the first direction is greater than the length of each of the first and second vertical patterns in the first direction,
wherein the horizontal layers include a single conductive layer,
wherein the third vertical pattern includes:
  a first side surface facing the fourth vertical pattern;
  a second side surface facing the first separation structure; and
  a third side surface extending from the first and second side surfaces,
wherein the fourth vertical pattern includes:
  a fourth side surface facing the third vertical pattern;
  a fifth side surface facing the second separation structure; and
  a sixth side surface extending from the fourth and fifth side surfaces,
wherein the single conductive layer includes:
  a first portion adjacent to the third side surface of the third vertical pattern;
  a second portion adjacent to the sixth side surface of the fourth vertical pattern;
  a first extension portion extending in a second direction from the first portion; and
  a second extension portion extending in a third direction from the second portion,
wherein the second direction is a direction from the first separation structure towards the second separation structure, and
wherein the third direction is a direction from the second separation structure towards the first separation structure,
wherein the second distance between the third vertical pattern and the fourth vertical pattern is greater than a third distance between the first extending portion and the second extending portion,
wherein at least one of the plurality of contact plugs is disposed at a center between the third vertical pattern and the fourth vertical pattern,
wherein the plurality of contact plugs are between the third vertical pattern and the fourth vertical pattern, and
wherein the plurality of contact plugs are not between the first vertical pattern and the fourth vertical pattern.

19. The semiconductor device as claimed in claim 18, further comprising:
  a vertical memory structure penetrating through the stack structure in a vertical direction,
  wherein the stack structure includes a gate stack region and an insulating stack region,
  wherein the horizontal layers of the gate stack region include a conductive material,
  wherein the horizontal layers of the insulating stack region include an insulating material,
  wherein the vertical memory structure penetrating through the gate stack region,
  wherein the insulating stack region includes:
    a first insulating stack region between the third vertical pattern and the fourth vertical pattern; and
    a second insulating stack region extending between the first vertical pattern and the second vertical pattern from the first insulating stack region, wherein the gate stack region includes:
- first gate stack regions adjacent to the first and second separation structures; and
- a second gate stack region extending between the first vertical pattern and the second vertical pattern from the first gate stack regions, wherein a portion of the second gate stack region is between the fifth vertical pattern and the sixth vertical pattern, wherein the vertical memory structure penetrates through the gate stack region of the stack structure in the vertical direction, and wherein the plurality of contact plugs penetrate through the insulating stack region of the stack structure in the vertical direction.

20. The semiconductor device as claimed in claim 1, wherein the stack structure includes a gate stack region and an insulating stack region,
- wherein the horizontal layers of the gate stack region include a conductive material, and
- wherein the horizontal layers of the insulating stack region include an insulating material, and wherein the fifth and sixth vertical patterns are between the gate stack region and the insulating stack region.

* * * * *